United States Patent
Wang et al.

(10) Patent No.: US 12,253,903 B2
(45) Date of Patent: *Mar. 18, 2025

(54) REMEDIAL ACTION INDICATION

(71) Applicant: Rambus Inc., San Jose, CA (US)

(72) Inventors: Yuanlong Wang, San Jose, CA (US); Frederick A. Ware, Los Altos Hills, CA (US)

(73) Assignee: Rambus Inc., San Jose, CA (US)

(*) Notice: Subject to any disclaimer, the term of this patent is extended or adjusted under 35 U.S.C. 154(b) by 0 days.

This patent is subject to a terminal disclaimer.

(21) Appl. No.: 18/140,133

(22) Filed: Apr. 27, 2023

(65) Prior Publication Data

US 2024/0184655 A1 Jun. 6, 2024

Related U.S. Application Data

(60) Continuation of application No. 17/728,621, filed on Apr. 25, 2022, now Pat. No. 11,669,379, which is a
(Continued)

(51) Int. Cl.
*G06F 11/07* (2006.01)
*G06F 3/06* (2006.01)
(Continued)

(52) U.S. Cl.
CPC ........ *G06F 11/0727* (2013.01); *G06F 3/0619* (2013.01); *G06F 3/064* (2013.01);
(Continued)

(58) Field of Classification Search
CPC ....... H04L 1/0061; H04L 1/08; H04L 1/1867; G06F 3/0619; G06F 3/064; G06F 3/0679;
(Continued)

(56) References Cited

U.S. PATENT DOCUMENTS

| 3,585,378 A | 5/1971 | Bouricius et al. |
| 3,893,072 A | 7/1975 | D'Antonio et al. |

(Continued)

OTHER PUBLICATIONS

Answers.com, "ECC Memory," http: www.answers.com/topic/eec-memory, obtained Jun. 20, 2006. 2 pages.
(Continued)

*Primary Examiner* — Samir W Rizk
(74) *Attorney, Agent, or Firm* — The Neudeck Law Firm, LLC

(57) ABSTRACT

A controller includes a link interface that is to couple to a first link to communicate bi-directional data and a second link to transmit unidirectional error-detection information. An encoder is to dynamically add first error-detection information to at least a portion of write data. A transmitter, coupled to the link interface, is to transmit the write data. A delay element is coupled to an output from the encoder. A receiver, coupled to the link interface, is to receive second error-detection information corresponding to at least the portion of the write data. Error-detection logic is coupled to an output from the delay element and an output from the receiver. The error-detection logic is to determine errors in at least the portion of the write data by comparing the first error-detection information and the second error-detection information, and, if an error is detected, is to assert an error condition.

20 Claims, 14 Drawing Sheets

Related U.S. Application Data continuation of application No. 17/068,515, filed on Oct. 12, 2020, now Pat. No. 11,340,973, which is a continuation of application No. 16/282,346, filed on Feb. 22, 2019, now Pat. No. 10,838,793, which is a continuation of application No. 16/022,791, filed on Jun. 29, 2018, now Pat. No. 10,241,849, which is a continuation of application No. 15/855,385, filed on Dec. 27, 2017, now Pat. No. 10,180,865, which is a continuation of application No. 15/341,959, filed on Nov. 2, 2016, now Pat. No. 9,875,151, which is a continuation of application No. 14/823,826, filed on Aug. 11, 2015, now abandoned, which is a continuation of application No. 14/806,011, filed on Jul. 22, 2015, now Pat. No. 9,298,543, which is a continuation of application No. 14/175,955, filed on Feb. 7, 2014, now Pat. No. 9,092,352, which is a continuation of application No. 13/752,324, filed on Jan. 28, 2013, now Pat. No. 8,656,254, which is a continuation of application No. 13/398,768, filed on Feb. 16, 2012, now Pat. No. 8,365,042, which is a continuation of application No. 13/013,779, filed on Jan. 25, 2011, now Pat. No. 8,132,077, which is a continuation of application No. 12/479,684, filed on Jun. 5, 2009, now Pat. No. 7,882,423, which is a division of application No. 11/330,524, filed on Jan. 11, 2006, now Pat. No. 7,562,285.

(51) Int. Cl.

| | | |
|---|---|---|
| *G06F 11/10* | (2006.01) | |
| *G06F 11/14* | (2006.01) | |
| *G06F 13/42* | (2006.01) | |
| *H03M 13/00* | (2006.01) | |
| *H03M 13/09* | (2006.01) | |
| *H03M 13/29* | (2006.01) | |
| *H04L 1/00* | (2006.01) | |
| *H04L 1/08* | (2006.01) | |
| *H04L 1/1867* | (2023.01) | |

(52) U.S. Cl.
CPC .......... *G06F 3/0679* (2013.01); *G06F 11/073* (2013.01); *G06F 11/0751* (2013.01); *G06F 11/076* (2013.01); *G06F 11/0793* (2013.01); *G06F 11/10* (2013.01); *G06F 11/1004* (2013.01); *G06F 11/1008* (2013.01); *G06F 11/1068* (2013.01); *G06F 11/1402* (2013.01); *G06F 13/4286* (2013.01); *H03M 13/09* (2013.01); *H03M 13/29* (2013.01); *H03M 13/2906* (2013.01); *H03M 13/611* (2013.01); *H04L 1/0061* (2013.01); *H04L 1/08* (2013.01); *H04L 1/1867* (2013.01); *G06F 11/1044* (2013.01); *H04L 1/0003* (2013.01); *H04L 1/0008* (2013.01); *H04L 2001/0093* (2013.01)

(58) Field of Classification Search
CPC .. G06F 11/1008; G06F 11/10; G06F 11/1004; G06F 11/1402; H03M 13/09; H03M 13/29; H03M 13/611; H03M 13/2906
See application file for complete search history.

(56) References Cited

U.S. PATENT DOCUMENTS

| | | |
|---|---|---|
| 4,054,911 A | 10/1977 | Fletcher et al. |
| 4,354,225 A | 10/1982 | Frieder et al. |
| 4,359,771 A | 11/1982 | Johnson et al. |
| 4,363,125 A | 12/1982 | Brewer et al. |
| 4,369,510 A | 1/1983 | Johnson et al. |
| 4,394,763 A | 7/1983 | Nagano et al. |
| 4,456,993 A | 6/1984 | Taniguchi et al. |
| 4,468,731 A | 8/1984 | Johnson et al. |
| 4,527,237 A | 7/1985 | Frieder et al. |
| 4,535,455 A | 8/1985 | Peterson |
| 4,543,628 A | 9/1985 | Pomfret |
| 4,584,685 A | 4/1986 | Gajjar |
| 4,596,014 A | 6/1986 | Holeman |
| 4,597,084 A | 6/1986 | Dynneson et al. |
| 4,604,750 A | 8/1986 | Manton et al. |
| 4,792,923 A | 12/1988 | Nakase et al. |
| 4,888,773 A | 12/1989 | Arlington |
| 4,899,342 A | 2/1990 | Potter et al. |
| 4,914,657 A | 4/1990 | Walter et al. |
| 4,920,539 A | 4/1990 | Albonesi |
| 4,924,456 A | 5/1990 | Maxwell et al. |
| 4,970,714 A | 11/1990 | Chen et al. |
| 5,048,022 A | 9/1991 | Bissett et al. |
| 5,065,312 A | 11/1991 | Bruckert et al. |
| 5,070,474 A | 12/1991 | Tuma et al. |
| 5,173,905 A | 12/1992 | Parkinson et al. |
| 5,193,181 A | 3/1993 | Barlow et al. |
| 5,218,691 A | 6/1993 | Tuma et al. |
| 5,313,627 A | 5/1994 | Amini et al. |
| 5,341,251 A | 8/1994 | Fincher et al. |
| 5,347,643 A | 9/1994 | Kondo et al. |
| 5,369,651 A | 11/1994 | Marisetty |
| 5,392,302 A | 2/1995 | Kemp et al. |
| 5,404,361 A | 4/1995 | Casorso et al. |
| 5,450,609 A | 9/1995 | Schultz et al. |
| 5,459,742 A | 10/1995 | Cassidy et al. |
| 5,488,691 A | 1/1996 | Fuoco et al. |
| 5,490,153 A | 2/1996 | Gregg et al. |
| 5,490,155 A | 2/1996 | Abdoo et al. |
| 5,502,733 A | 3/1996 | Kishi et al. |
| 5,550,988 A | 8/1996 | Sarangdhar et al. |
| 5,553,231 A | 9/1996 | Papenberg et al. |
| 5,559,956 A | 9/1996 | Sukegawa |
| 5,588,112 A | 12/1996 | Dearth et al. |
| 5,687,183 A | 11/1997 | Chesley |
| 5,729,550 A | 3/1998 | Nakajima et al. |
| 5,751,932 A | 5/1998 | Horst et al. |
| 5,751,955 A | 5/1998 | Sonnier et al. |
| 5,778,419 A | 7/1998 | Hansen et al. |
| 5,784,390 A | 7/1998 | Masiewicz et al. |
| 5,838,899 A | 11/1998 | Leavitt et al. |
| 5,841,795 A | 11/1998 | Olarig et al. |
| 5,987,628 A | 11/1999 | Von Bokern et al. |
| 5,999,446 A | 12/1999 | Harari et al. |
| 6,003,151 A | 12/1999 | Chuang |
| 6,009,542 A | 12/1999 | Koller et al. |
| 6,012,136 A | 1/2000 | Brown |
| 6,029,264 A | 2/2000 | Kobayashi et al. |
| 6,035,037 A | 3/2000 | Chaney |
| 6,038,679 A | 3/2000 | Hanson |
| 6,048,090 A | 4/2000 | Zook |
| 6,065,146 A | 5/2000 | Bosshart |
| 6,081,145 A | 6/2000 | Bandai et al. |
| 6,094,732 A | 7/2000 | Takano |
| 6,115,763 A | 9/2000 | Douskey |
| 6,125,470 A | 9/2000 | Hee et al. |
| 6,151,689 A | 11/2000 | Garcia et al. |
| 6,169,710 B1 | 1/2001 | Arai |
| 6,189,123 B1 | 2/2001 | Anders Nystrom et al. |
| 6,208,663 B1 | 3/2001 | Schramm et al. |
| 6,212,660 B1 | 4/2001 | Joeressen et al. |
| 6,243,845 B1 | 6/2001 | Tsukamizu et al. |
| 6,249,894 B1 | 6/2001 | Lin et al. |
| 6,308,294 B1 | 10/2001 | Ghosh et al. |
| 6,314,541 B1 | 11/2001 | Seytter et al. |
| 6,367,048 B1 | 4/2002 | McAuliffe et al. |
| 6,373,842 B1 | 4/2002 | Coverdale et al. |
| 6,393,504 B1 | 5/2002 | Leung et al. |
| 6,397,365 B1 | 5/2002 | Brewer et al. |
| 6,438,723 B1 | 8/2002 | Kalliojarvi |
| 6,507,928 B1 | 1/2003 | Richardson |
| 6,529,561 B2 | 3/2003 | Sipola |
| 6,545,994 B2 | 4/2003 | Nelson et al. |

(56) References Cited

U.S. PATENT DOCUMENTS

| | | |
|---|---|---|
| 6,553,003 B1 | 4/2003 | Chang |
| 6,560,725 B1 | 5/2003 | Longwell et al. |
| 6,606,589 B1 | 8/2003 | Tuma et al. |
| 6,625,749 B1 | 9/2003 | Quach |
| 6,646,911 B2 | 11/2003 | Hidaka |
| 6,697,986 B2 | 2/2004 | Kim et al. |
| 6,700,867 B2 | 3/2004 | Classon et al. |
| 6,704,898 B1 | 3/2004 | Furuskar et al. |
| 6,715,116 B2 | 3/2004 | Lester et al. |
| 6,725,414 B2 | 4/2004 | Seyyedy |
| 6,735,726 B2 | 5/2004 | Muranaka et al. |
| 6,742,159 B2 | 5/2004 | Sakurai |
| 6,745,364 B2 | 6/2004 | Bhatt et al. |
| 6,754,856 B2 | 6/2004 | Cofler et al. |
| 6,760,814 B2 | 7/2004 | Corrigan |
| 6,765,740 B2 | 7/2004 | Tsuchiya |
| 6,779,148 B2 | 8/2004 | Tanaka |
| 6,779,150 B1 | 8/2004 | Walton et al. |
| 6,792,501 B2 | 9/2004 | Chen et al. |
| 6,823,424 B2 | 11/2004 | Larson et al. |
| 6,832,340 B2 | 12/2004 | Larson et al. |
| 6,845,472 B2 | 1/2005 | Walker et al. |
| 6,851,081 B2 | 2/2005 | Yamamoto |
| 6,880,103 B2 | 4/2005 | Kim et al. |
| 6,883,130 B2 | 4/2005 | Wilhelmsson et al. |
| 6,892,159 B2 | 5/2005 | Weiss et al. |
| 6,909,758 B2 | 6/2005 | Ramesh et al. |
| 6,912,682 B1 | 6/2005 | Aoki |
| 6,931,582 B2 | 8/2005 | Tamura et al. |
| 6,941,493 B2 | 9/2005 | Phelps |
| 6,977,888 B1 | 12/2005 | Frenger et al. |
| 6,990,604 B2 | 1/2006 | Binger |
| 7,027,539 B2 | 4/2006 | Yang et al. |
| 7,047,473 B2 | 5/2006 | Hwang et al. |
| 7,072,307 B2 | 7/2006 | Tong et al. |
| 7,168,023 B2 | 1/2007 | Morgan et al. |
| 7,200,770 B2 | 4/2007 | Hartwell et al. |
| 7,231,580 B2 | 6/2007 | Shiota et al. |
| 7,249,289 B2 | 7/2007 | Muranaka et al. |
| 7,257,762 B2 | 8/2007 | Holm et al. |
| 7,310,757 B2 | 12/2007 | Ngo et al. |
| 7,339,759 B2 | 3/2008 | Hashimoto |
| 7,340,641 B1 | 3/2008 | Binger |
| 7,355,803 B2 | 4/2008 | Yang |
| 7,418,436 B2 | 8/2008 | Maeda et al. |
| 7,421,647 B2 | 9/2008 | Matsui et al. |
| 7,519,894 B2 | 4/2009 | Wei et al. |
| 7,523,381 B2 | 4/2009 | Eggleston et al. |
| 7,529,965 B2 | 5/2009 | Ikeuchi et al. |
| 7,548,495 B2 | 6/2009 | Kobayashi |
| 7,562,285 B2 | 7/2009 | Wang et al. |
| 7,570,447 B2 | 8/2009 | Koga et al. |
| 7,624,298 B2 | 11/2009 | Kasahara et al. |
| 7,636,262 B2 | 12/2009 | Kim et al. |
| 7,657,783 B2 | 2/2010 | Levitan |
| 7,836,386 B2 | 10/2010 | Schumacher et al. |
| 7,831,882 B2 | 11/2010 | Tsern et al. |
| 7,831,888 B2 | 11/2010 | Wang et al. |
| 7,882,423 B2 | 2/2011 | Wang et al. |
| 7,949,931 B2 | 5/2011 | Lastras-Montano |
| 7,996,731 B2 | 8/2011 | Macri et al. |
| 8,042,023 B2 | 10/2011 | Balb |
| 8,132,077 B2 | 3/2012 | Yang et al. |
| 8,352,805 B2 | 1/2013 | Shaeffer et al. |
| 8,365,042 B2 | 1/2013 | Wang et al. |
| 8,555,116 B1 | 10/2013 | Shaeffer et al. |
| 8,656,254 B2 | 2/2014 | Wang et al. |
| 8,892,963 B2 | 11/2014 | Macri et al. |
| 9,298,543 B2 * | 3/2016 | Wang .................. G06F 11/0751 |
| 9,477,547 B2 | 10/2016 | Wang et al. |
| 9,875,151 B2 * | 1/2018 | Wang .................. H04L 1/0061 |
| 10,180,865 B2 | 1/2019 | Wang et al. |
| 10,241,849 B2 | 3/2019 | Wang et al. |
| 10,838,793 B2 * | 11/2020 | Wang ................. H03M 13/2906 |
| 11,340,973 B2 | 5/2022 | Wang et al. |
| 2001/0056567 A1 | 12/2001 | Sakurai |
| 2002/0053042 A1 | 5/2002 | Brown |
| 2002/0112204 A1 | 8/2002 | Biskup et al. |
| 2002/0144210 A1 | 10/2002 | Borkenhagen et al. |
| 2003/0066010 A1 | 4/2003 | Acton |
| 2003/0088805 A1 | 5/2003 | Majni et al. |
| 2003/0115417 A1 | 6/2003 | Corrigan |
| 2003/0177434 A1 | 9/2003 | Su et al. |
| 2004/0073649 A1 | 4/2004 | Inami et al. |
| 2004/0088497 A1 | 5/2004 | Deans et al. |
| 2004/0139310 A1 | 7/2004 | Maeda et al. |
| 2004/0205433 A1 | 10/2004 | Gower |
| 2004/0209420 A1 | 10/2004 | Ljungcrantz et al. |
| 2004/0237001 A1 | 11/2004 | Schulz et al. |
| 2004/0264030 A1 | 12/2004 | Yang |
| 2005/0055522 A1 | 3/2005 | Yagi |
| 2005/0073899 A1 | 4/2005 | Gallivan et al. |
| 2005/0262241 A1 | 11/2005 | Gubbi et al. |
| 2006/0075291 A1 | 4/2006 | Takahashi |
| 2006/0077750 A1 | 4/2006 | Pescatore |
| 2006/0098320 A1 | 5/2006 | Koga et al. |
| 2006/0123483 A1 | 6/2006 | Cohen |
| 2006/0126460 A1 | 6/2006 | Kobayashi |
| 2006/0277434 A1 | 12/2006 | Tsern et al. |
| 2007/0002482 A1 | 1/2007 | Daikokuya et al. |
| 2007/0011562 A1 | 1/2007 | Alexander et al. |
| 2007/0016698 A1 | 1/2007 | Vogt |
| 2007/0043917 A1 | 2/2007 | Matsui et al. |
| 2007/0104327 A1 | 5/2007 | Macri et al. |
| 2007/0150872 A1 | 6/2007 | Vohra |
| 2007/0162825 A1 | 7/2007 | Wang et al. |
| 2007/0226597 A1 | 9/2007 | Taito et al. |
| 2008/0046802 A1 | 2/2008 | Honda |
| 2008/0163007 A1 | 7/2008 | Shaeffer et al. |
| 2008/0195922 A1 | 8/2008 | Lee |
| 2009/0006863 A1 | 1/2009 | Mizuno |
| 2009/0204871 A1 | 8/2009 | Eggleston et al. |
| 2010/0217915 A1 | 8/2010 | O'Connor et al. |
| 2011/0246857 A1 | 10/2011 | Bae et al. |
| 2012/0179866 A1 | 7/2012 | Davis et al. |

OTHER PUBLICATIONS

Cardarilli et al., "Design of a Fault Tolerant Solid State Mass Memory," IEEE Transactions of Reliability, vol. 52, No. 4, Dec. 2003, pp. 476-491. 16 pages.

Dell Computer Corporation et al., "Serial ATA II: Electrical Specification," Rev. 1, May 26, 2004. 187 pages.

Digital Equipment Corporation, "ESE50 SDI Solid State Disk Service Guide," Jun. 1993. 132 pages.

Digital Equipment Corporation. "ESE50 SDI Solid State Disk: User Guide," Jun. 1993. 33 pages.

Digital Equipment Corporation, "Hardware Documentation— Machines DEC-VAX Hardware Reference," printed from http://www.netbsd.org/documentation/hardware/Machines/DEC/vax on May 13, 2005. 91 pages.

Digital Equipment Corporation, "Software Product Description, Product Name: HSC High Performance Software, Ver. 8.6," Jun. 1996. 6 pages.

Digital Equipment Corporation, "Software Product Description, Product Name: HSC Software, Ver. 6.5," Jun. 1992. 4 pages.

Geisler, J., "Error Detection & Correction," Taylor University, Computer and System Sciences Department, Sep. 16, 2005. 21 pages.

Grosspietsch et al., "A Memory Interface Chip Designed for Fault Tolerance," VLSI System Design, Jun. 1987, pp. 112-118. 5 pages.

Grosspietsch et al., "The VLSI Implementation of a Fault-Tolerant Memory Interface—a Status Report," VLSI '85, 1986, pp. 155-164. 10 pages.

Haas et al., "Advances in Server Memory Technology." presented at Spring 2005 Intel Developers Forum, San Francisco, CA, Mar. 1, 2005. 31 pages.

Hanna, P., "Error Detection and Correction," Lecture 9, Queen's University-Belfast, Jan. 3, 2005. 12 pages.

(56) References Cited

OTHER PUBLICATIONS

Hodgart et al., "A (16,8) Error Correcting Code (T=2) for Critical Memory Applications." DASIA2000, Montreal, Canada, May 22-26, 2000, 4 pages.
Kilbuck et al., "Fully Buffered DIMM—Unleashing Server Capacity," Micron Technology, Inc., Apr. 8, 2005. 199 pages.
May et al., "HiPER: A Compact Narrow Channel Router with Hop-by-Hop Error Correction," IEEE Transactions on Parallel and Distributed Systems, vol. 13. No. 5, May 2002, pp. 485-498. 14 pages.
MMCA Technical Committee, "The MultiMediaCard," System Secification, Version 3.31, May 2003. 150 pages.
Non-Final Office Action dated Feb. 4, 2016 re: U.S. Appl. No. 14/823,826. 10 pages.
PCT International Preliminary Report on Patentability dated Aug. 12, 2008 in International Application No. PCT/US2007/011733. 22 pages.
PCT International Search Report and Written Opinion dated Jan. 11, 2008 in International Application No. PCT/US2007/011733. 13 pages.
PCT International Search Report and Written Opinion dated Mar. 6, 2007 in International Application No. PCT/US2006/020698. 16 pages.
Pearson Education, "Error Detection and Correction," Logic and Computer Design Fundamentals, 3rd Ed., 2004, pp. 1-5. 5 pages.
SanDisk Corporation, "Flash ChipSet Product Manual," Revision 5, Oct. 1998. 134 pages.
SanDisk Corporation, "SanDisk SD Card. Product Manual," Version 2.2, Document No. 80-13-00169, Nov. 2004, 123 pages.
Siewiorek, Dan, "20 Fault Tolerance & Memory Hierarchy," Lecture Handout, Carnegie Mellon University, Nov. 23, 1998. 18 pages.
Wang, Yuanlong, U.S. Appl. No. 12/479,684, filed Jun. 5, 2009, Amendment in Response to Office Action of Apr. 26, 2010. 9 pages.
Wang, Yuanlong, U.S. Appl. No. 12/479,684, filed Jun. 5, 2009, Notice of Allowance and Fee(s) mailed Sep. 20, 2010. 4 pages.
Wang, Yuanlong, U.S. Appl. No. 12/479,684, filed Jun. 5, 2009, Office Action with mail date of Apr. 16, 2010. 10 pages.
Wang, Yuanlong, U.S. Appl. No. 12/479,684, filed Jun. 5, 2009, Office Action with mail date of Apr. 26, 2010. 10 Pages.
Wang, Yuanlong, U.S. Appl. No. 12/479,688, filed Jun. 5, 2009, Notice of Allowance and Fee(s) Due with mail date of Jul. 19, 2010 and Proposed Amendment. 18 pages.
Wang, Yuanlong, U.S. Appl. No. 12/479,688, filed Jun. 5, 2009, Preliminary Amendment dated May 13, 2010. 7 Pages.
Wang, Yuanlong, U.S. Appl. No. 13/013,779, filed Jan. 25, 2011, Notice of Allowance and Fee(s) Due mailed Oct. 28, 2011. 19 pages.
Wang, Yuanlong. U.S. Appl. No. 13/013,779, filed Jan. 25, 2011, Preliminary Amendment dated May 9, 2011. 14 Pages.
Wang, Yuanlong, U.S. Appl. No. 13/013,779, filed Jan. 25, 2011, Supplemental Notice of Allowability dated Nov. 8, 2011. 7 pages.
Wicker, Stephen B., "Error Control Systems for Digital Communications and Storage," Prentice-Hall, 1995, pp. 392-423. 17 pages.
Wikipedia, "Forward Error Correction," http://en.wikipedia.org/wiki/forward_error_correction, Printed Jun. 20, 2006. 3 pages.

\* cited by examiner

REMEDIAL ACTION INDICATION

FIELD

The subject matter disclosed herein relates generally to integrated circuits, methods and systems having error detection, error correction and/or retry modes of operation using a bidirectional data link.

BACKGROUND

Low bit-error-rate (BER) communication of data over a communications channel is often considered an important requirement in many systems. In the case of memory devices and systems, fulfilling this requirement is increasingly difficult due to signaling and circuit limitations. In future memory devices and systems, scaling of interface circuitry to accommodate higher data rates may be restricted by transistor sensitivity and threshold limits. In addition, even though interconnect lengths and a loss tangent may be constant, the higher data rates may increase noise due to an increased bandwidth. Given constraints on interface overhead and latency, developing faster interfaces with a low BER may become more challenging and expensive. This poses a problem, since conventional interfaces in memory devices and systems typically have an extremely low BER. For example, the BER in the interface in a dynamic random access memory (DRAM) is typically less than a soft error rate in the DRAM core, i.e., less than $10^{-30}$. If the BER in the interface increases in future high-speed designs, ensuring reliability with different processes, systems and environments for conventional memory devices and systems may be difficult.

BRIEF DESCRIPTION OF THE DRAWINGS

For a better understanding, reference should be made to the following detailed description taken in conjunction with the accompanying drawings, in which.

Like reference numerals refer to corresponding parts throughout the drawings.

DETAILED DESCRIPTION OF EMBODIMENTS

Figure 1:
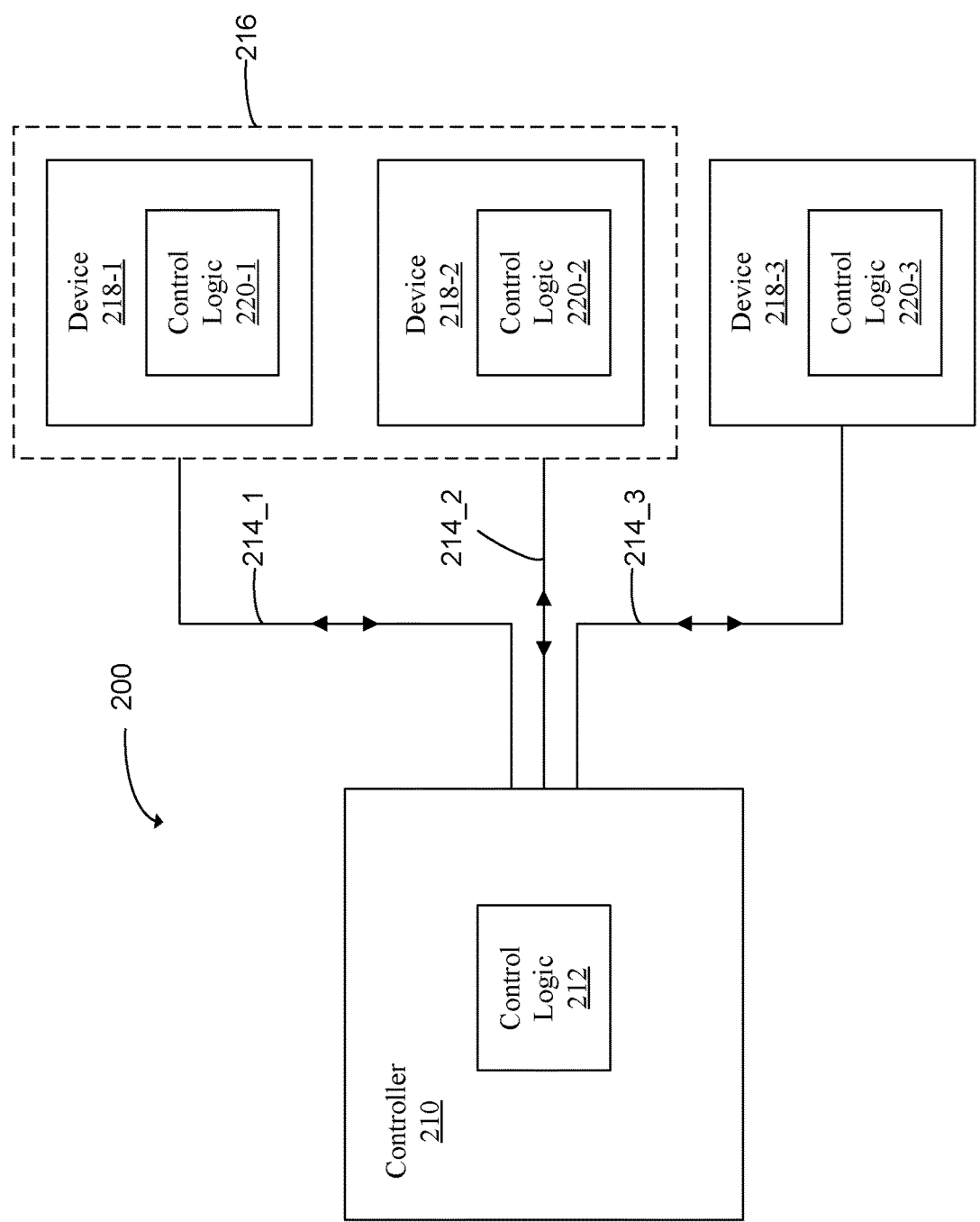
FIG. 1 is a block diagram illustrating an embodiment of a system.

A controller is described. In some embodiments, the controller may be a memory controller. The controller includes a first link interface that is to couple to a first link to communicate bi-directional data and a second link to transmit unidirectional error-detection information. A first encoder is to dynamically add first error-detection information to at least a portion of write data. A first transmitter, coupled to the first link interface, is to transmit the write data. A first delay element is coupled to an output from the first encoder. A first receiver, coupled to the first link interface, is to receive read data. A second encoder, coupled to an output from the first receiver, is to dynamically add second error-detection information to at least a portion of the read data. A second receiver, coupled to the first link interface, is to receive third error-detection information corresponding to at least the portion of the read data and fourth error-detection information corresponding to at least the portion of the write data. First error-detection logic is coupled to an output from the first delay element, an output from the second encoder and an output from the second receiver. The first error-detection logic is to determine errors in at least the portion of the write data by comparing the first error-detection information and the fourth error-detection information, and is to determine errors in at least the portion of the read data by comparing the second error-detection information and the third error-detection information. If an error is detected, the first error-detection logic is to assert an error condition.

The controller may include retry logic and/or instructions to perform a retry remedial action if the error condition is asserted. The retry remedial action may include re-transmitting the write data using the first transmitter and the first link interface. The retry remedial action may include re-receiving the read data using the first receiver and the first link interface after the read data is re-transmitted by a device.

The controller may include a third encoder to dynamically add fifth error-detection information to at least a portion of write mask information, and a second transmitter coupled to an output from the third encoder and to the first link interface. The first link interface is to couple to a third link to transmit unidirectional command information including the fifth error-detection information, and the first link interface is to couple to the first link to communicate the write mask information.

In another embodiment, a device is described. In some embodiments, the device may be a memory device, including a memory core that utilizes solid-state memory, semiconductor memory, organic memory and/or another memory material. The device includes a second link interface that is to couple to the first link to communicate bi-directional data and the second link to transmit unidirectional error-detection information. A fourth encoder is to dynamically add the third error-detection information to at least the portion of the read data. A second transmitter, coupled to the second link interface, is to transmit the read data. A third receiver, coupled to the second link interface, is to receive the write data. A fifth encoder, coupled to an output from the third receiver, is to dynamically add the fourth error-detection information to at least the portion of the write data. A third transmitter is coupled to the second link interface, and is selectively coupled to one of an output from the fourth encoder and an output from the fifth encoder.

The read data may be re-transmitted using the second transmitter and the second link interface if the device receives remedial action instructions from the controller. The write data may be re-received using the third receiver and the second link interface if the device receives remedial action instructions from the controller.

The device may include a sixth encoder, coupled to an output from the third receiver, to dynamically add sixth error-detection information to at least the portion of the write mask information. The second link interface is to couple to the third link to receive the unidirectional command information. A fourth receiver, coupled to the second link interface, is to receive the fifth error-detection information. Second error-detection logic, coupled to an output from the fourth receiver and an output from the sixth encoder, is to determine errors in at least the portion of the write mask information by comparing the fifth error-detection information and the sixth error-detection information. If an error is detected, the second error-detection logic is to disable a write operation to the memory core.

In another embodiment, a system is described. In some embodiments, the system may be a memory system. The system includes the controller and at least the device. The first link interface in the controller is coupled to the first link and the second link. The second link interface in the device is coupled to the first link and the second link. In some embodiments, the first link interface in the controller and the second link interface in the device may each be coupled to the third link.

In another embodiment, a process for operating a controller is described. The first error-detection information is dynamically added to at least the portion of the write data. The write data is transmitted. The fourth error-detection information corresponding to at least the portion of the write data is received. The fourth error-detection information is compared to a delayed version of the first error-detection information to determine errors in at least the portion of the write data. If an error is detected, an error condition is asserted.

In another embodiment, a process for operating a controller is described. The read data is received. The second error-detection information is dynamically added to at least the portion of the read data. The third error-detection information corresponding to at least the portion of the read data is received. The second error-detection information is compared to the third error-detection information to determine errors in at least the portion of the read data. If an error is detected, an error condition is asserted.

In another embodiment, a process for operating a device is described. The write mask information is received. The sixth error-detection information is dynamically added to at least the portion of the write mask information. The fifth error-detection information corresponding to at least the portion of the write mask information is received. The fifth error-detection information and the sixth error-detection information are compared to determine errors in at least the portion of the write mask information. If an error is detected, a write operation to the memory core is disabled.

In some embodiments, dynamically adding error-detection information may include generating and/or incorporating pre-existing error-detection code information and/or error correction code information (such as a Bose-Chaudhuri-Hochquenghem code) into at least a portion of the transmit data (such as in one or more write data packets and/or one or more read data packets) and/or at least a portion of the write mask information. In some embodiments, the generated error-detection code information is only used locally, i.e., it is not transmitted with the write data and/or the write mask information. In some embodiments, the dynamic adding of respective error-detection code information may include generating and/or incorporating pre-existing error-detection code information or error correction code information into at least a portion of command information, such as commands or address information. In some embodiments, the error-detection code information (such as one or more parity bits or parity codes) and/or error correction code information may be generated in real time in accordance with at least a portion of the transmit data, the write mask information and/or the command information. Such dynamically generated error-detection code information and/or error correction code information may then be used locally and/or incorporated into the transmit data, the write mask information and/or the command information.

In some embodiments, the controller and/or the device may include instructions for and/or may perform one or more additional actions during a respective retry remedial action. The one or more additional actions may be mediated by retry information transmitted from the controller to the device and/or from the device to the controller. The instructions for and/or the performance of the one or more additional actions may include re-transmitting write data, read data, command information and/or write mask information with at least a portion of the re-transmitted write data, read data, command information and/or write mask information having error protection provided by an error correction code that is dynamically generated. The instructions for and/or the performance of the one or more additional actions may include re-transmitting write data, read data, command information and/or write mask information with improved bit error rate (BER). For example, re-transmission may use a circuit having a power greater than that used in a previous transmission for improved transmit characteristics; re-transmission may clock the respective data or information with one symbol per clock cycle (as opposed to transmitting on both rising and falling clock edges or transmitting multiple symbols per clock cycle); re-transmission may use a data or information rate that is less than that used in the previous transmission by adjusting, for example, a clock generator; re-transmission may use a data or information stream having blanks inserted before and/or after the respective data or information in order to have an intersymbol interference that is less than that in the previous transmission; re-transmission may use a different modulation code than that used in the previous transmission by adjusting, for example, a modulator; re-transmission may use a voltage swing that is greater than that used in the previous transmission by adjusting, for example, a voltage generator; re-transmission may use a number of pins that are coupled to one or more of the links (such as the first link, the second link and/or the third link) that is less than the number of pins coupled to one or more of the links in the previous transmission; re-transmission may occur after a predetermined idle time (such as 1, 2 or several clock cycles, or 1, 2 or 3 symbol periods, where a symbol period is an amount of time associated with communication of a symbol of write data or read data); and/or re-transmission may use another transmitter and/or receiver in the controller and/or in the device.

While some embodiments include separate first and second links (i.e., side band communication) to communicate the bi-directional data and the unidirectional error-detection information between the controller and the device, in other embodiments the bi-directional data and the unidirectional error-detection information may be communicated using a common link (i.e., in-band signaling). Such in-band signaling may utilize a technique including time division multiplexing, frequency division multiplexing and/or spread-spectrum signaling.

In some embodiments, the first link, the second link and/or the third link may include one or more pins, one or more lines or wires, one or more pairs of wires, one or more reference or back planes, one or more interconnects, one or more interfaces and/or one or more communications channels. The links may be used for inter-chip communication, such as between one or more semiconductor chips or dies, or for communication within a semiconductor chip, also known as intra-chip communication, such as between modules in an integrated circuit.

In some embodiments, the controller and/or the device may include control logic. The control logic may delay subsequent write operations to the device until the retry remedial action is completed, may delay command operations to a location in the device corresponding to the write or read data until the retry remedial action is completed, or may reorder receive data after the retry remedial action is completed in order to restore the read data received from the device during remedial action to a position corresponding to an original sequence of command operations.

The controller may also include a buffer. The buffer may be used to avoid data hazards. The write data to be transmitted to the device may be temporarily stored in the buffer and, if a read to a location in the device corresponding to the write data occurs during the retry remedial action, the write data may be obtained from the buffer.

By incorporating the error detection, error correction and/or retry modes of operation in the controller, the device or systems including at least one controller and at least one device, the embodiments allow occasional interconnect- or communications-channel-induced bit errors and thereby may allow a reduction in the BER requirements of the interconnect. Such an additional degree of freedom may enable interconnects having increased bandwidth at lower cost and with less complexity.

Reference will now be made in detail to embodiments, examples of which are illustrated in the accompanying drawings. In the following detailed description, numerous specific details are set forth in order to provide a thorough understanding of the subject matter presented herein. However, it will be apparent to one of ordinary skill in the art that the subject matter may be practiced without these specific details. In other instances, well-known methods, procedures, components, and circuits have not been described in detail so as not to unnecessarily obscure aspects of the embodiments.

Attention is now directed towards embodiments that address the difficulties associated with the existing memory systems described above. These embodiments may be utilized in one or more controllers, one or more devices and/or one or more systems. In some embodiments, the one or more controllers may be memory controllers, the one or more devices may be memory devices and/or the one or more systems may be memory systems.

FIG. 1 is a block diagram illustrating an embodiment of a system 200. The system 200 includes at least one controller 210 and one or more devices 218. While FIG. 1 illustrates the system 200 having one controller 210 and three devices 218, other embodiments may have additional controllers and fewer or more devices 218. The controller 210 has control logic 212 and each device 218 has control logic 220. In other embodiments, some of the devices 218 may not have the control logic 220. In embodiments where the devices 218 are memory devices, two or more of the devices, such as devices 218-1 and 218-2, may be configured as a memory bank 216.

The controller 210 and the devices 218 are connected by one or more links 214. While the system 200 illustrates three links 214, other embodiments may have fewer or more links 214. The links 214 may be used for bi-directional and/or uni-directional communications between the controller 210 and one or more of the devices 218. Bi-directional communication may be simultaneous. In some embodiments, one or more of the links 214 and the corresponding transmitters, such as transmitters 312 (FIG. 2A), and/or receivers, such as receivers 322 (FIG. 2A), may be dynamically configured, for example, by control logic 212, for bi-directional and/or unidirectional communication.

Data may be communicated on one or more of the links 214 using one or more sub-channels, such as a baseband sub-channel corresponding to a first frequency band and/or a passband sub-channel corresponding to a second frequency band. In some embodiments, such as those where at least one of the links 214 is ac-coupled, the baseband sub-channel may not contain DC (i.e., does not include 0 Hz). In some embodiments, the first frequency band and the second frequency band may be orthogonal. In other embodiments there may be substantial overlap of one or more neighboring pairs of frequency bands. A respective sub-channel may also correspond to a group of frequency bands.

The control logic 212 in the system 200 may be configured to dynamically allocate and/or adjust one or more frequency bands, such as the first frequency band and/or the second frequency band, based on a predetermined data rate, for example, multiple gigabits per second ("Gbits/s" or "Gbps"), between the controller 210 and at least one of the devices 218 and/or the predetermined data rate between at least one of the devices 218 and the controller 210. The control logic 212 may dynamically allocate and/or adjust one or more frequency bands in at least one link 214 by adjusting at least one corresponding transmitter, such as one of the transmitters 312 (FIG. 2A), and at least one corresponding receiver, such as one of the receivers 322 (FIG. 2B). In this example, adjustments to at least one of the transmitters 312 (FIG. 2A) and/or at least one of the receivers 322 (FIG. 2B) may be communicated from the controller 210 to at least one of the devices 218 using at least one of the links 214.

While the embodiment 200 couples the controller 210 to multiple devices 218, in other embodiments two or more controllers may be coupled to one another. The coupled controllers may utilize the unidirectional transfer of error code information described below.

The challenges associated with the existing systems may be at least partially addressed by encoding error detection codes or information on both sides of a link, for example, in a controller and in one or more devices. Two versions of the error-detection information, one generated in the controller and another generated in one or more devices, may be compared in the controller. If errors are detected, an error condition may be asserted and corresponding remedial action, such as re-transmitted write and/or read data, may be taken. The error-detection information may be communicated between the device and the controller using in-band signaling or sideband communication. As described further below with reference to FIG. 4, this approach may reduce an overall latency.

Figure 2A:
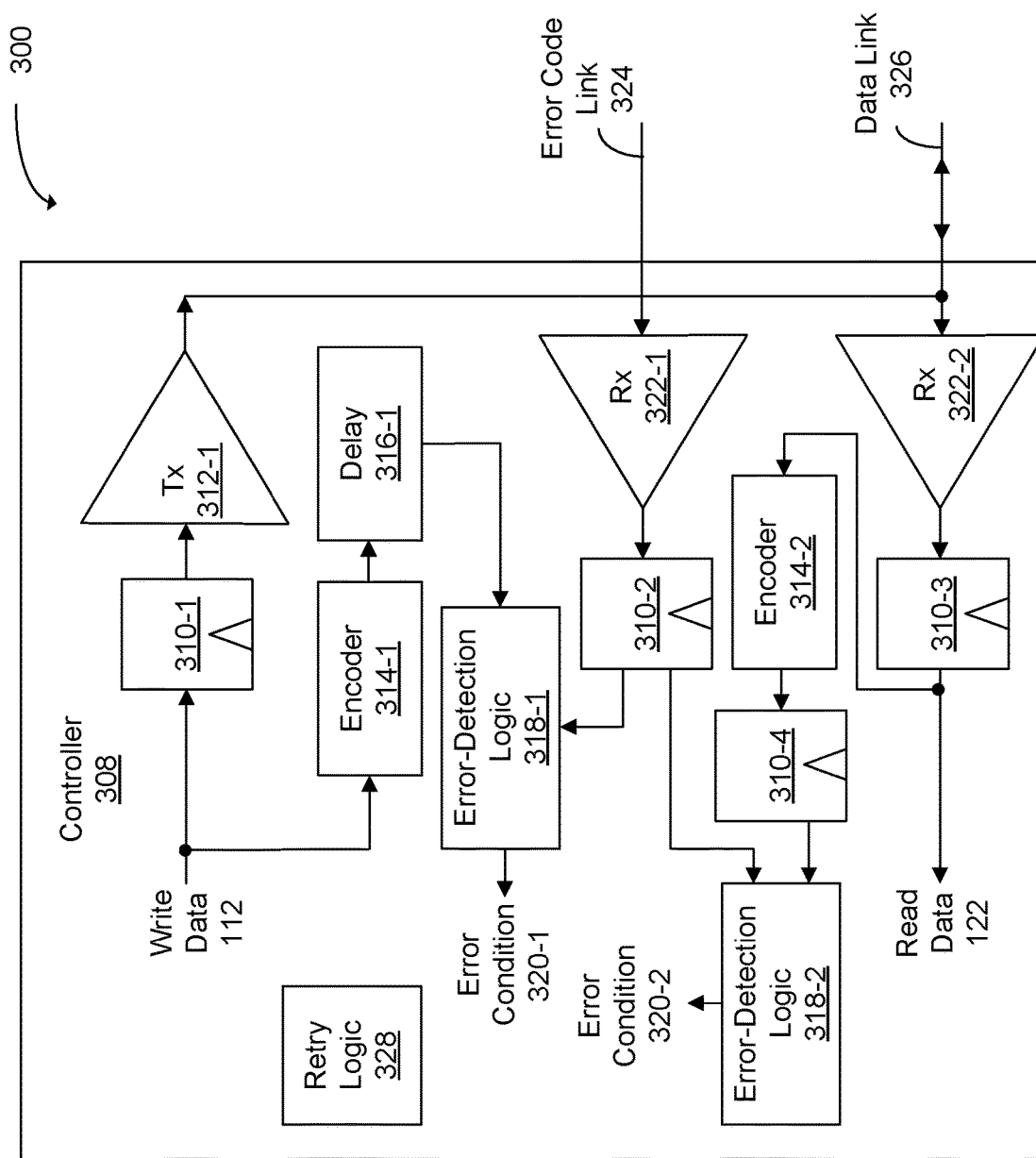
FIG. 2A is a block diagram illustrating an embodiment of a controller.
Figure 2B:
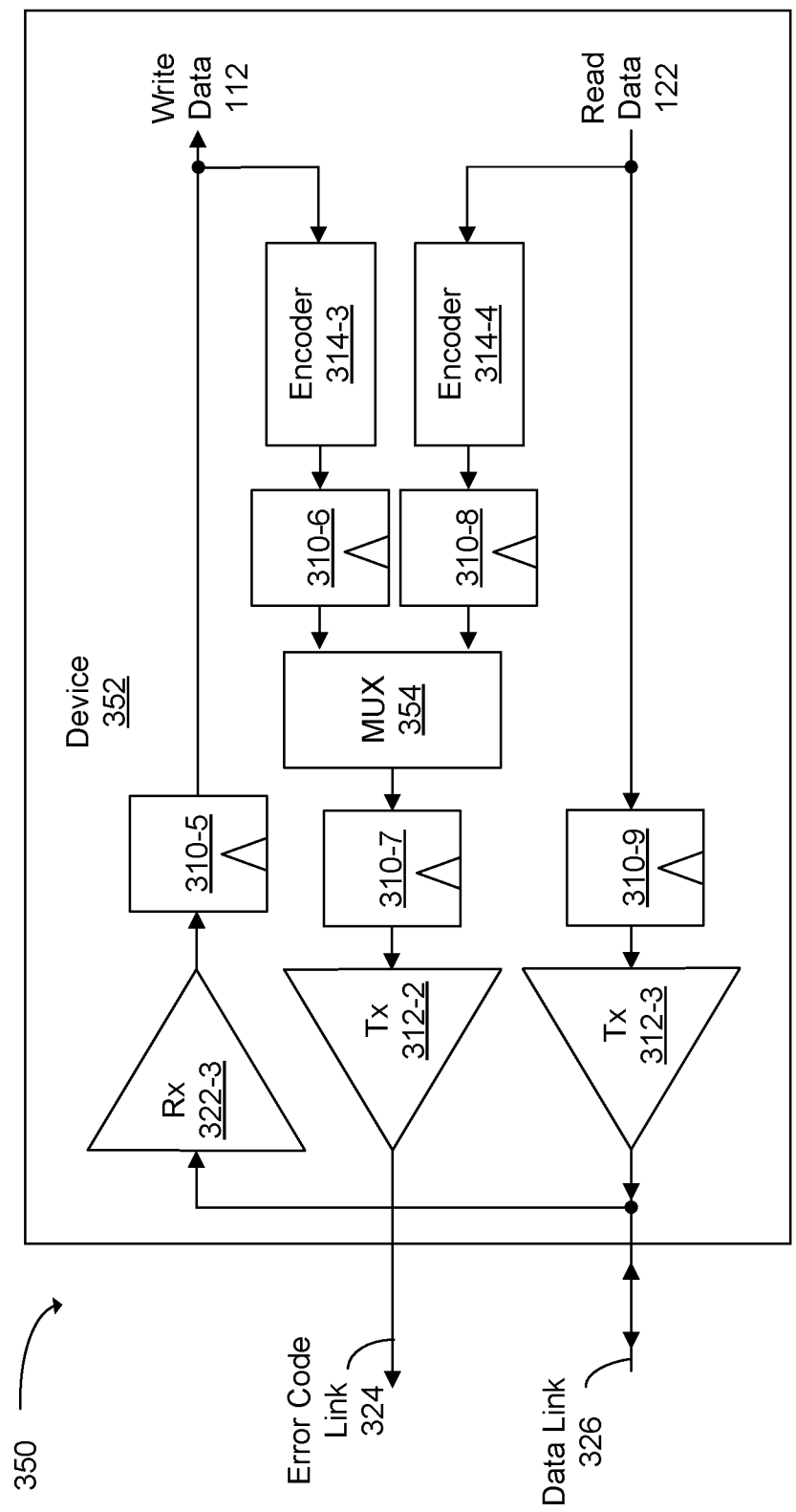
FIG. 2B is a block diagram illustrating an embodiment of a device.

FIG. 2A is a block diagram illustrating an embodiment 300 of a controller 308 incorporating unidirectional error code information transfer. Write data 112 may be synchronized using a flip-flop 310-1 (which is gated by a clock signal that is not shown) and transmitted using transmitter 312-1 on bi-directional data link 326. The write data 112 may also be encoded using encoder 314-1 to generate first write-data error-detection information. An embodiment of an encoder, such as the encoder 314-1 is described further below with reference to FIG. 6. The first write-data error-detection information may be delayed by delay element 316-1 and coupled to error-detection logic 318-1. The delay element 316-1 may compensate for a round-trip delay discussed further below.

Referring to FIG. 2B, which illustrates an embodiment 350 of a device 352, the write data 112 may be received by a receiver 322-3 and synchronized using a flip-flop 310-5 (which is gated by a clock signal that is not shown). The received write data 112 may be coupled to an encoder 314-3 to generate second write-data error-detection information. The second write-data error-detection information may be synchronized using a flip-flop 310-6 and selectively coupled to subsequent components using multiplexer 354. An output from the multiplexer 354 may be synchronized using a flip-flop 310-7 and transmitted on unidirectional error code link 324 using transmitter 312-2.

Referring back to FIG. 2A, the second write-data error-detection information may be received by the controller 308 using receiver 322-1. The second write-data error-detection information may be synchronized using a flip-flop 310-2 and coupled to the error-detection logic 318-1. The error-detection logic 318-1 may compare the first write-data error-detection information and the second write-data error-detection information to determine if the write data 112 was received by the device 352 without error. For example, the error detection logic 318-1 may detect an error using a multi-bit XOR operation in conjunction with one or more parity bits associated with the write data 112. If an error is detected, the error-detection logic 318-1 may assert an error condition 320-1. Retry logic 328 may perform remedial action if the error condition 320-1 is asserted. The remedial action may include re-transmitting the write data 112 to the device 352.

Referring back to FIG. 2B, a similar procedure may be utilized for read data 122. The read data 122 may be synchronized using a flip-flop 310-9 and transmitted using transmitter 312-3 on the bi-directional data link 326. The read data 122 may also be encoded using encoder 314-4 to generate first read-data error-detection information. The first read-data error-detection information may be synchronized using a flip-flop 310-8 and selectively coupled to subsequent components using the multiplexer 354. An output from the multiplexer 354 may be synchronized using the flip-flop 310-7 and transmitted on the unidirectional error code link 324 using the transmitter 312-2.

Referring to FIG. 2A, the read data 122 may be received by a receiver 322-2 and synchronized using the flip-flop 310-3. The received read data 122 may be coupled to an encoder 314-2 to generate second read-data error-detection information. The second read-data error-detection information may be synchronized by a flip-flop 310-4 and coupled to error-detection logic 318-2. The controller 308 may also receive the first read-data error-detection information using the receiver 322-1. The first read-data error-detection information may be synchronized using the flip-flop 310-2 and coupled to the error-detection logic 318-2. The error-detection logic 318-2 may compare the first read-data error-detection information and the second read-data error-detection information to determine if the read data 122 was received by the controller 308 without error. If an error is detected, the error-detection logic 318-2 may assert an error condition 320-2. The retry logic 328 may perform remedial action if the error condition 320-2 is asserted. The remedial action may include transmitting retry information to the device 352 (using a command link that is not shown) such that the read data 122 may be re-transmitted to the controller 308.

In some embodiments, at least one of the transmitters 312 may perform parallel-to-serial conversion. In some embodiments, at least one of the receivers 322 may perform serial-to-parallel conversion. While the retry logic 328 is incorporated in the controller 308 in the embodiment 300, in other embodiments the retry logic 328 may be a separate component. The retry logic 328 may include hardware, such as logic gates to detect and/or interpret the respective error condition, and/or software, including instructions corresponding to the retry remedial action. Providing retry logic that can initiate retry remedial actions enables a system to use transmit and receive data rates greater than a first threshold while maintaining an error rate lower than a second threshold. In some embodiments the first threshold may be on the order of approximately 1 Gbps, 2 Gbps, 5 Gbps or 10 Gbps. In an exemplary embodiment, the second threshold is $10^{-20}$ with error condition detection and retry. If error detection and retry are not used, the second threshold may be $10^{-10}$.

In an exemplary embodiment, the flip-flops 310 have a one clock cycle delay. The delay element 316-1 has a delay of five clock cycles. A bandwidth used in the error code link 324 may be much less than a bandwidth used in the data link 326.

While not shown, the controller 308 may include one or more modulators, one or more de-modulators, one or more voltage generators and at least one clock generator. The one or more voltage generators may generate one or more voltage signals that set signal levels of one or more of the transmitters 312 and/or the receivers 322. The clock generator may generate one or more clock signals that control timing of transmitting and receiving of data by one or more of the transmitters 312 and/or the receivers 322 using one or more of the flip-flops 310. The one or more modulators and/or the one or more de-modulators may implement bit-to-symbol coding and symbol-to-bit coding, respectively. Suitable symbol coding may include two or more level pulse amplitude modulation (PAM), such as two-level pulse amplitude modulation (2PAM), four-level pulse amplitude modulation (4PAM), eight-level pulse amplitude modulation (8PAM), sixteen-level pulse amplitude modulation (16PAM) or a higher level pulse amplitude modulation. In embodiments with one or more passband sub-channels, multi-level PAM is also referred to as multi-level on-off keying (OOK), such as two-level on-off keying (2OOK), four-level on-off keying (4OOK), eight-level on-off keying (8OOK) or a higher level on-off keying. Suitable coding in one or more passband sub-channels may also include two or more level quadrature amplitude modulation (QAM).

The controller 308 (FIG. 2A) and the device 352 (FIG. 2B) may have fewer or more components. Functions of two or more components (as described above) may be implemented in a single component. Alternatively, functions of some components may be implemented in additional instances of the components. While the embodiments 300 (FIG. 2A) and 350 (FIG. 2B) illustrate one transmitter 312 and two receivers 322, and two transmitters 312 and one receiver 322, respectively, there may be fewer or more of these components. While the data link 326 has been illustrated as bi-directional, as noted previously this may include simultaneous bi-directional communication, reconfiguration for unidirectional communication, as well as dynamic configuration of the data link 326.

Figure 3:
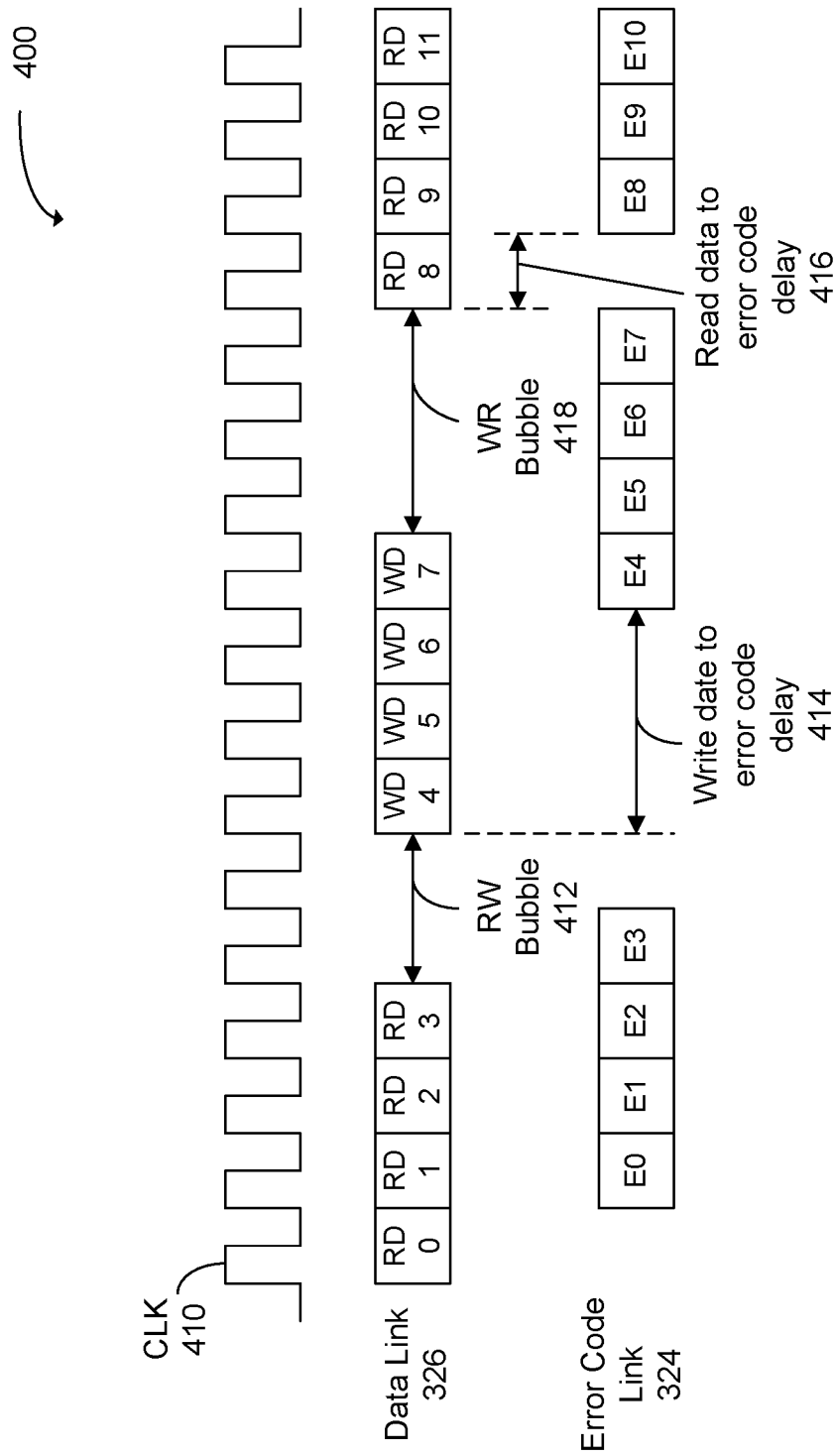
FIG. 3 is a diagram illustrating a data stream and an error code stream in an embodiment of a system.

FIG. 3 is a diagram illustrating a data stream on the data link 326 and an error code stream on the error code link 324 in an embodiment of a system 400 corresponding to the embodiments 300 (FIG. 2A) and 350 (FIG. 2B). The system 400 illustrates a read-write (RW) bubble 412 and a write-read (WR) bubble 418. While the system 400 illustrates single rate clocking, in other embodiments dual data rate clocking (i.e., clocking on rising and falling edges of clock 410) or other data rates with multiple symbols per clock cycle may be used. While there is a larger write data to error code delay 414 in the approach utilized in embodiments 300 (FIG. 2A) and 350 (FIG. 2B), the overall latency is reduced. By delaying the read error code information relative to the read data, as illustrated by read data to error code delay 416, a single encode delay may be utilized, thereby allowing read data to be returned more quickly.

As mentioned previously, while embodiments 300 (FIG. 2A) and 350 (FIG. 2B) illustrate an approach using sideband communication, via the error code link 324, in other embodiments in-band signaling may be utilized. This is illustrated in FIGS. 4A and 4B.

Figure 4A:
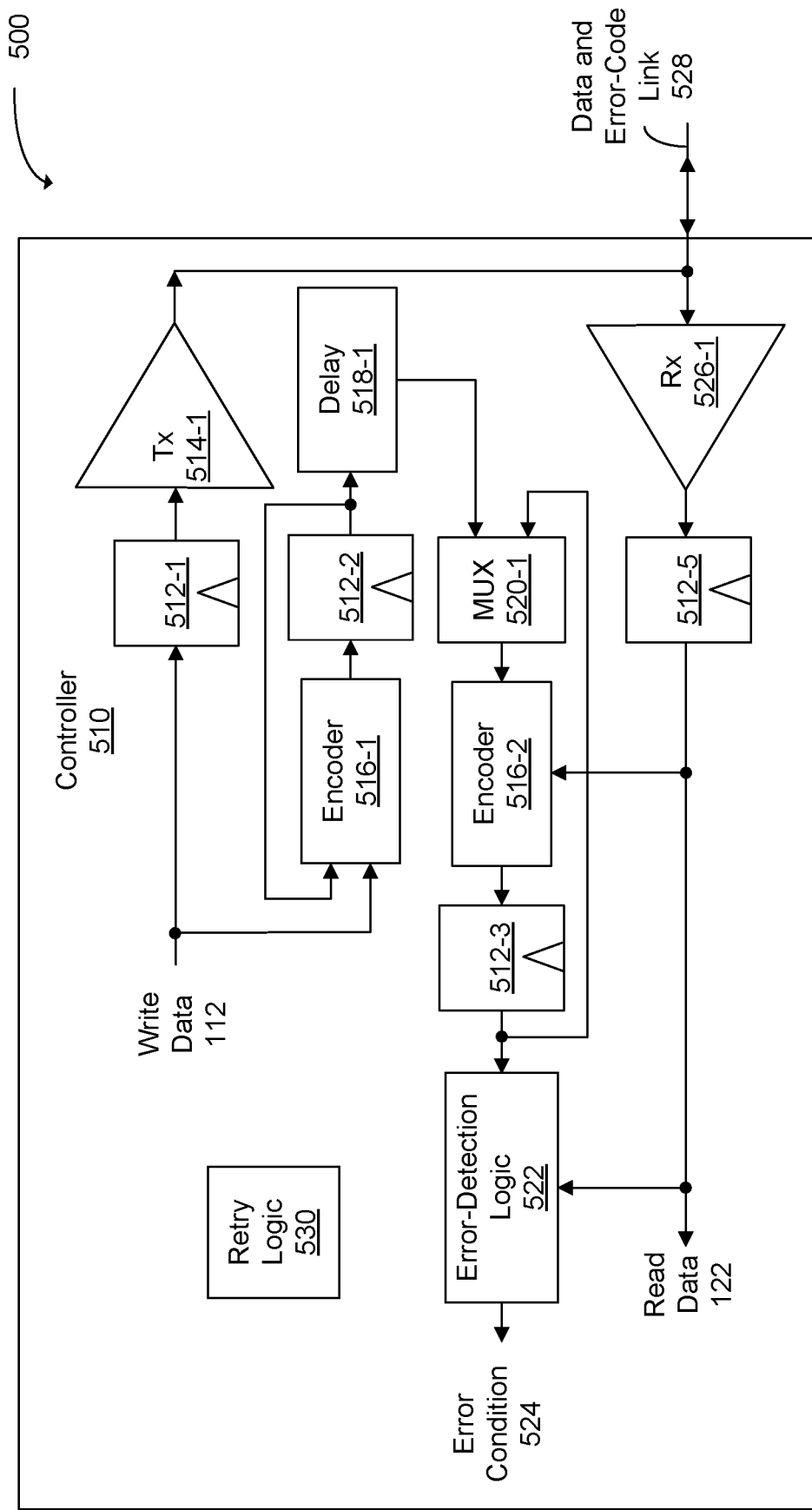
FIG. 4A is a block diagram illustrating an embodiment of a controller.

FIG. 4A is a block diagram illustrating an embodiment 500 of a controller 510 incorporating unidirectional error code information transfer. The write data 112 may be synchronized using a flip-flop 512-1 (which is gated by a clock signal that is not shown) and transmitted using transmitter 514-1 on bi-directional data and unidirectional error-code link 528. The write data 112 may also be encoded using encoder 516-1 and flip-flop 512-2 to generate first write-read error-detection information. The feedback loop may allow encoding of a group of write data 112 symbols or data packets. The first write-read error-detection information may be delayed by delay element 518-1 (to compensate for a delay in receiving a burst of read data 122 discussed further below) and coupled to a multiplexer 520-1. The multiplexer may selectively couple the first write-read error-detection information or a feedback loop to an encoder 516-2 (the feedback loop may allow encoding of a group of write data 112 symbols or data packets along with a group of read data 122 symbols or data packets). The encoder 516-2 may also have read data 122 as an input. The encoder 516-2 may generate second write-read error-detection information. An output from the encoder 516-2 may be synchronized using flip-flop 512-3 and may be coupled to error-detection logic 522.

Figure 4B:
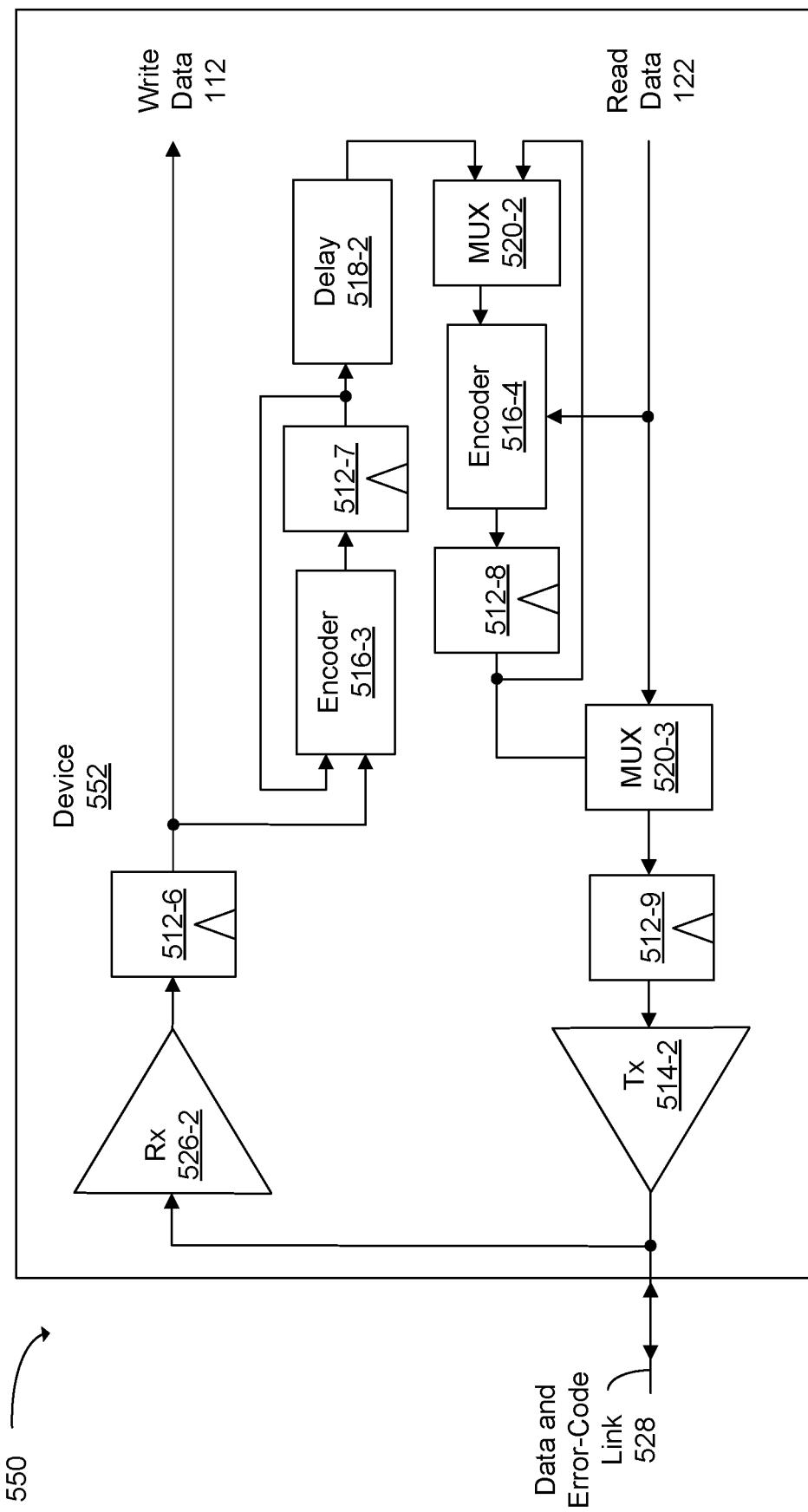
FIG. 4B is a block diagram illustrating an embodiment of a device.

Referring to FIG. 4B, which illustrates an embodiment 550 of a device 552, the write data 112 may be received by a receiver 526-2 and synchronized using a flip-flop 512-6 (which is gated by a clock signal that is not shown). The received write data 112 may be encoded using encoder 516-3 and flip-flop 512-7 to generate third write-read error-detection information. The feedback loop may allow encoding of a group of received write data 112 symbols or data packets. The third write-read error-detection information may be delayed by delay element 518-2 (to compensate for a delay in receiving a burst of read data 122) and coupled to a multiplexer 520-2. The multiplexer may selectively couple the third write-read error-detection information or a feedback loop to an encoder 516-4 (the feedback loop may allow encoding of a group of received write data 112 symbols or data packets along with a group of read data 122 symbols or data packets). The encoder 516-4 may also have read data 122 as an input. The encoder 516-4 may generate fourth write-read error-detection information. An output from the encoder 516-4 may be synchronized using flip-flop 512-8 and coupled to multiplexer 520-3. The multiplexer 520-3 may selectively couple the fourth write-read error-detection information or the read data 122 to a flip-flop 512-9 (for synchronization) and to a transmitter 514-2. The transmitter 514-2 may transmit the read data 122 and/or the fourth write-read error-detection information on the data and error-code link 528.

Referring back to FIG. 4A, the read data 122 and/or the fourth write-read error-detection information may be received by the controller 510 using receiver 526-1. The fourth write-read error-detection information and/or the read data 122 may be synchronized using a flip-flop 512-5. As mentioned previously, the read data 122 may be coupled to the encoder 516-2. The fourth write-read error-detection information may be coupled to the error-detection logic 522. The error-detection logic 522 may compare the second write-read error-detection information and the fourth write-read error-detection information to determine if the write data 112 was received by the device 552 without error and if the read data 122 was received by the controller 510 without error. For example, the error detection logic 522 may detect an error using a multi-bit XOR operation in conjunction with one or more parity bits associated with the write data 112 and the read data 122. If an error is detected, the error-detection logic 522 may assert an error condition 524. Retry logic 530 may perform remedial action if the error condition 524 is asserted. The remedial action may include re-transmitting the write data 112 to the device 552 and re-transmitting the read data to the controller 510. The remedial action may include transmitting retry information to the device 552 (using a command link that is not shown) such that the read data 122 may be re-transmitted to the controller 510.

In some embodiments, at least one of the transmitters 514 may perform parallel-to-serial conversion. In some embodiments, at least one of the receivers 526 may perform serial-to-parallel conversion. While the retry logic 530 is incorporated in the controller 510 in the embodiment 500, in other embodiments the retry logic 530 may be a separate component. The retry logic 530 may include hardware, such as logic gates to detect and/or interpret the respective error condition, and/or software, including instructions corresponding to the retry remedial action. The retry remedial action may enables transmit and receive data rates greater than the first threshold with an error rate lower than the second threshold. In some embodiments the first threshold may be on the order of approximately 1 Gbps, 2 Gbps, 5 Gbps or 10 Gbps. In an exemplary embodiment, the second threshold is $10^{-20}$ with error condition detection and retry. If error detection and retry are not used, the second threshold may be $10^{-10}$.

In an exemplary embodiment, the flip-flops 512 have a one clock cycle delay. The delay elements 518 may delay the most recent encoded write data 112 until the next burst of read data 122 is received. If a read burst is not received within a pre-determined time interval, the controller 510 may instruct the device 552 to provide the fourth write-read error detection information directly without waiting for the read burst using a command transmitted on the command link (not shown). Time division multiplexing may be utilized on the data and error-code link 528 to interleave the write data 112, the read data 122 and the fourth write-read error-detection information. The encoders 516 may generate error-detection information for four data packets of write data 112 and four data packets of read data 122 which are coded as a group. Each data packet may include thirty-two bits of data. The data and error-code link 528 may include sixteen parallel signal lines. The encoders 516 may, at least in part, implement a vertical/horizontal parity code in conjunction with a cyclic redundancy code (CRC). In other embodiments, the encoders 516 may implement a CRC code, a parity code, a Hamming code, a Reed-Solomon code, and/or another error checking and correction code.

While not shown, the controller 510 may include one or more modulators, one or more de-modulators, one or more voltage generators and at least one clock generator. The one or more voltage generators may generates one or more voltage signals that set signal levels of one or more of the transmitters 514 and/or the receivers 526. The clock generator may generate one or more clock signals that control timing of transmitting and receiving of data by one or more of the transmitters 514 and/or the receivers 526 using one or more of the flip-flops 512. The one or more modulators and/or the one or more de-modulators may implement bit-to-symbol coding and symbol-to-bit coding, respectively. Suitable symbol coding may include two or more level pulse amplitude modulation (PAM), such as two-level pulse amplitude modulation (2PAM), four-level pulse amplitude modulation (4PAM), eight-level pulse amplitude modulation (8PAM), sixteen-level pulse amplitude modulation (16PAM) or a higher level pulse amplitude modulation. In embodiments with one or more passband sub-channels, multi-level PAM is also referred to as multi-level on-off keying (OOK), such as two-level on-off keying (2OOK), four-level on-off keying (4OOK), eight-level on-off keying (8OOK) or a higher level on-off keying. Suitable coding in one or more passband sub-channels may also include two or more level quadrature amplitude modulation (QAM).

The controller 510 and the device 552 (FIG. 4B) may have fewer or more components. Functions of two or more components (as described above) may be implemented in a single component. Alternatively, functions of some components may be implemented in additional instances of the components. While the embodiments 500 and 550 (FIG. 4B) illustrate one transmitter 514 and one receiver 526 there may be fewer or more of these components. While the data and error-code link 528 has been illustrated as bi-directional for data and unidirectional for error-code information, as noted previously this may include simultaneous bi-directional communication, reconfiguration for unidirectional communication, as well as dynamic configuration of the data and error-code link 528.

Figure 5:
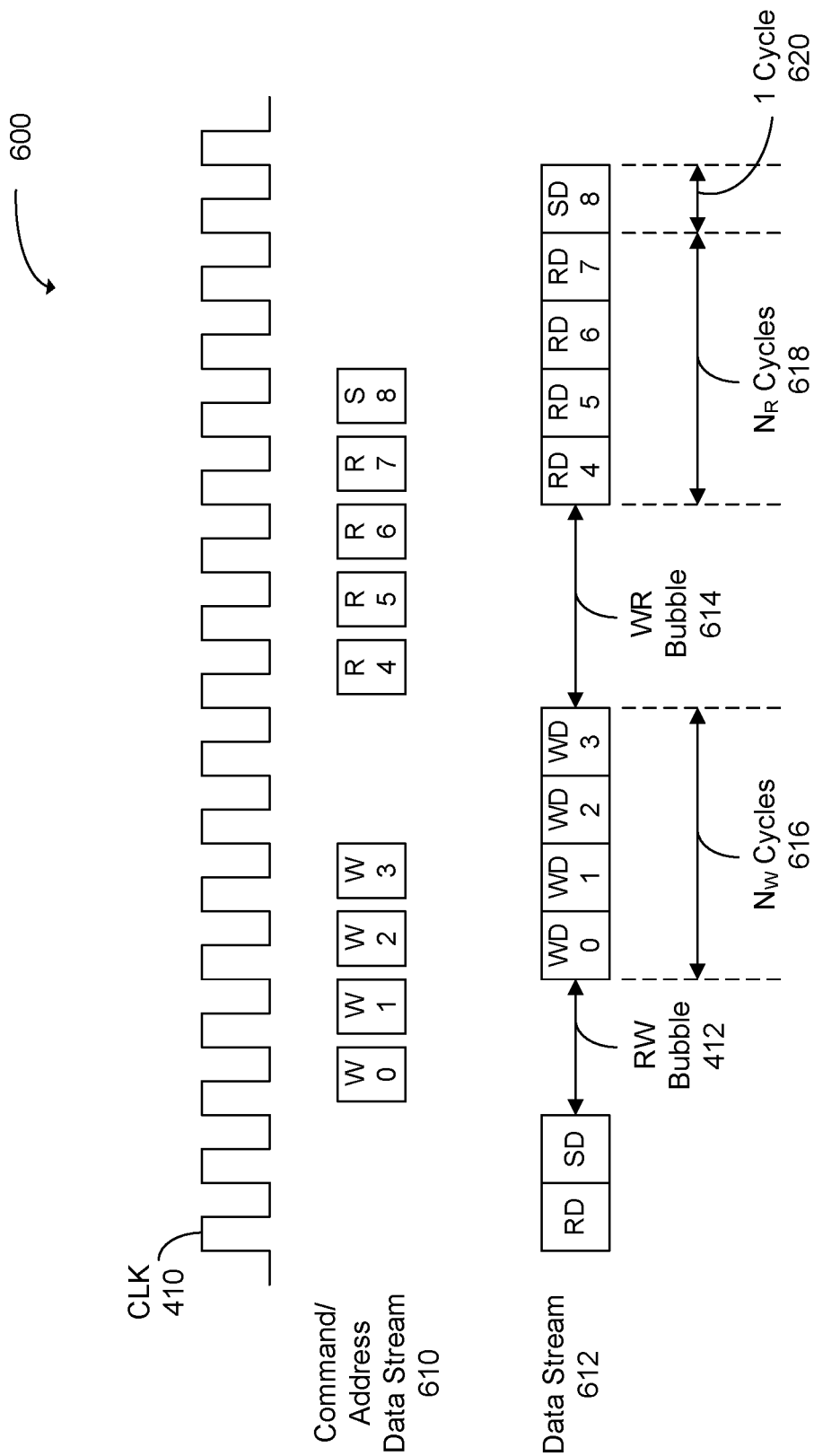
FIG. 5 is a diagram illustrating a data stream and a command stream in an embodiment of a system.

FIG. 5 is a diagram illustrating a data stream 612 and a command stream 610 in an embodiment of a system 600 corresponding to the embodiments 500 (FIG. 4A) and 550 (FIG. 4B). While the system 600 illustrates single rate clocking, in other embodiments dual data rate clocking (i.e., clocking on rising and falling edges of the clock 410) or other data rates with multiple symbols per clock cycle may be used. In the system 600, read and write data are separated by read-write (RW) bubble 412 and write-read bubble (WR) 614. In the encoders 516, $N_W$ cycles 616 of write data 112 and NR cycles 618 of read data 122 are concatenated and encoded. The resulting write-read error-detection information (SD) is transmitted during cycle 620. Cycle 620 may coincide with a synchronization command (S) sent by the controller 510 (FIG. 4A) at the end of a read command sequence. As described previously, in an exemplary embodiment, the $N_W$ cycles 616 and the NR cycles 618 may number four.

Figure 6:
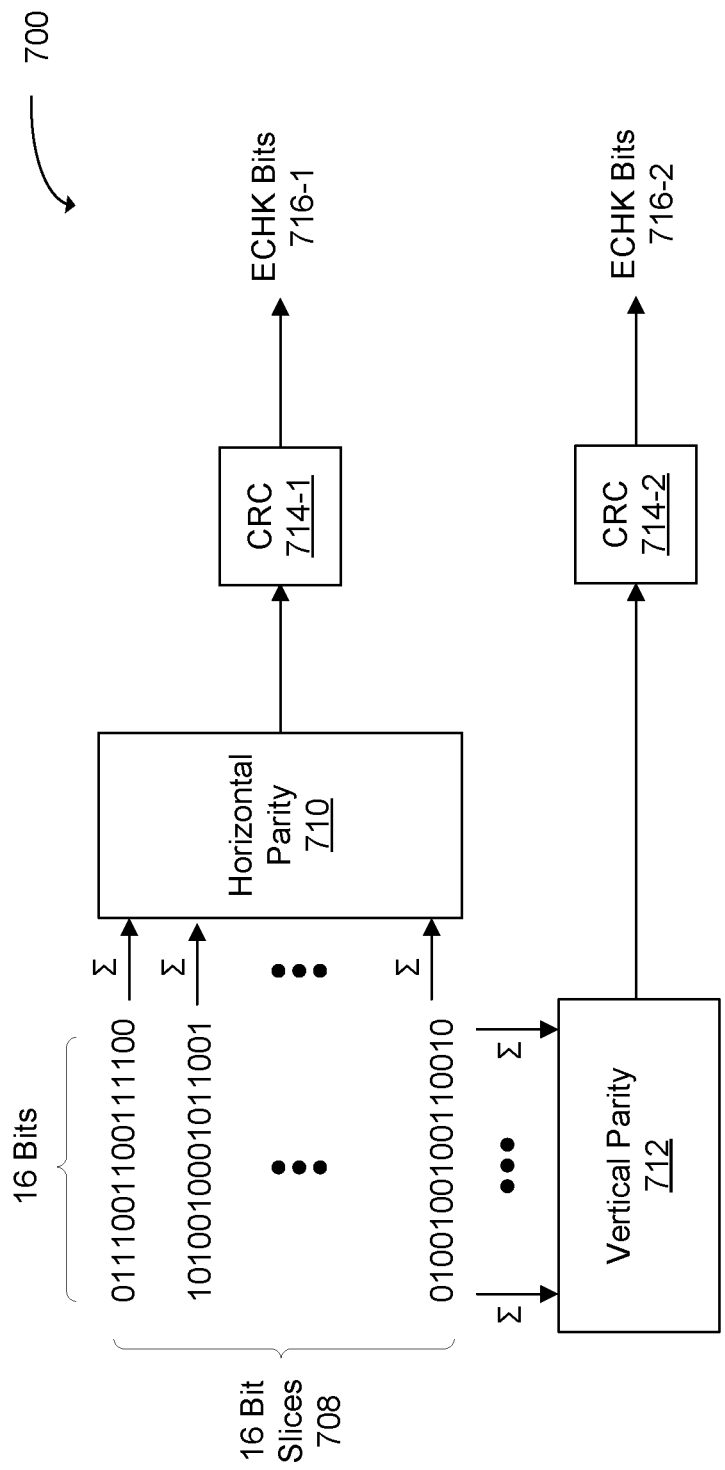
FIG. 6 is a block diagram illustrating an embodiment of generating error code bits.

FIG. 6 is a block diagram illustrating an embodiment 700 of generating error code bits, such as the write or read error-detection information in embodiments 300 (FIG. 2A) and 350 (FIG. 2B). Sixteen bit slices 708, each containing sixteen bits, are bit-wise summed to generate horizontal parity 710 and vertical parity 712, respectively. The input data may include two-hundred fifty-six bits of write data 112 or two-hundred fifty-six bits of read data 122. The input bits in embodiment 700 are intended as an illustration. Other embodiments may use a different number of bits and/or a different number of bit slices.

The horizontal parity is encoded using a CRC coder 714-1 and the vertical parity is encoded using a CRC coder 714-2. In an exemplary embodiment, each of the CRC coders 714 may implement six-bit encoding using six XOR gates each having sixteen inputs. The CRC coders 714 may output write or read error-detection information or error check (ECHK) bits 716, which are also referred to as check codes. In an exemplary embodiment, each CRC coder 714 may output six bits for a given set of input data, such as horizontal or vertical input bits. An additional four blank bits may also be included. Note that in general a CRC encoder with a k-bit check code can cover up to $2^{k-1}-k-1$ input data bits. The check code (k bits) and the data bits (up to $2^{k-1}-k-1$ bits) together are called a code word. Any one-bit, two-bit or three-bit errors and any burst errors with length at most k in a code word can be detected by the CRC code. The CRC coder 714 may use the polynomial $$X^6+X^5+X^3+X^2+X+1$$

as a generation polynomial. The horizontal and vertical parity bits may be multiplied with a generation matrix corresponding to the generation polynomial to generate the check codes.

A further approach addresses the issue of write masking when a bidirectional data link, such as the data link 326 (FIG. 2A), couples a memory controller and a memory device. Write mask information permits individual bytes of write data 112 to be written or not-written into a respective column address location. Such write mask information may be transferred between a controller, such as the controller 308 (FIG. 2A), and a device, such as the device 352 (FIG. 2B), using sideband communication or in-band signaling. In embodiments with a sideband link, there may be ⅛ fewer signal lines than in the data link. In in-band signaling, the write mask information may be communicated on the data link. A write key technique may be used or bandwidth in the data link may be allocated explicitly for the write mask information. In these embodiments, the data rate of the write mask information may be the same as that used for the write data.

Whether write mask information is communicated using sideband communication or in-band signaling, it may be susceptible to errors during communication on a link. The remedial action and retry instructions described previously may not, however, adequately address errors in the write mask information. This is because an error in the write mask information may result in erroneous overwriting of a byte location that is not supposed to be overwritten. In the case of an error in the received write data 112, the bad data in the device, such as the device 352 (FIG. 2B), is only a copy. The original write data 112 is in the controller, such as the controller 308 (FIG. 2A), and may be re-transmitted. In the case of some errors in the write mask information, however, the only copy of data at a byte location that is not to be written resides at that byte location in the device. There is no copy in the controller. As a consequence, an error in the write mask information could destroy the only copy of the data at that byte location.

Figure 7A:
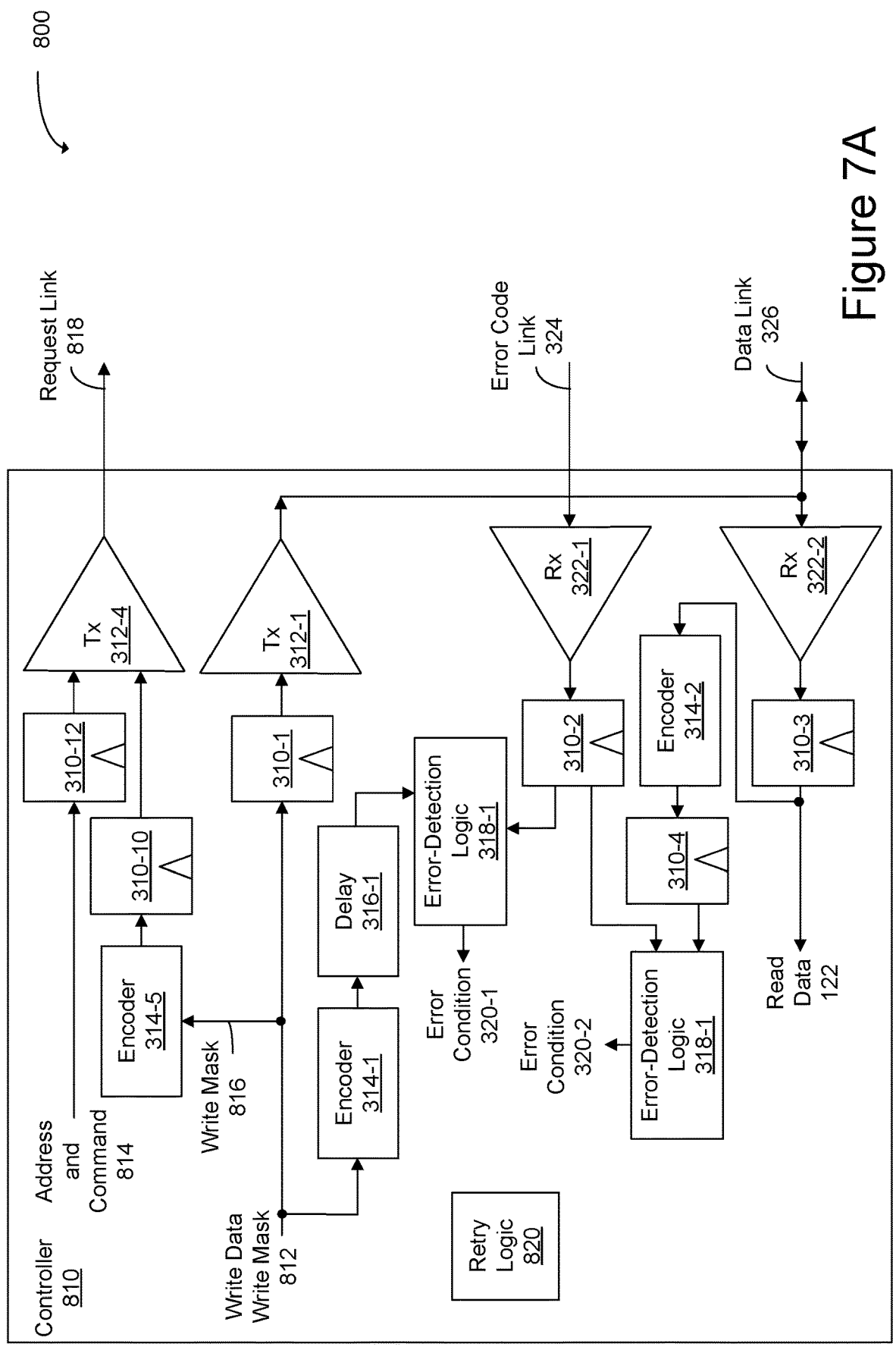
FIG. 7A is a block diagram illustrating an embodiment of a controller.
Figure 7B:
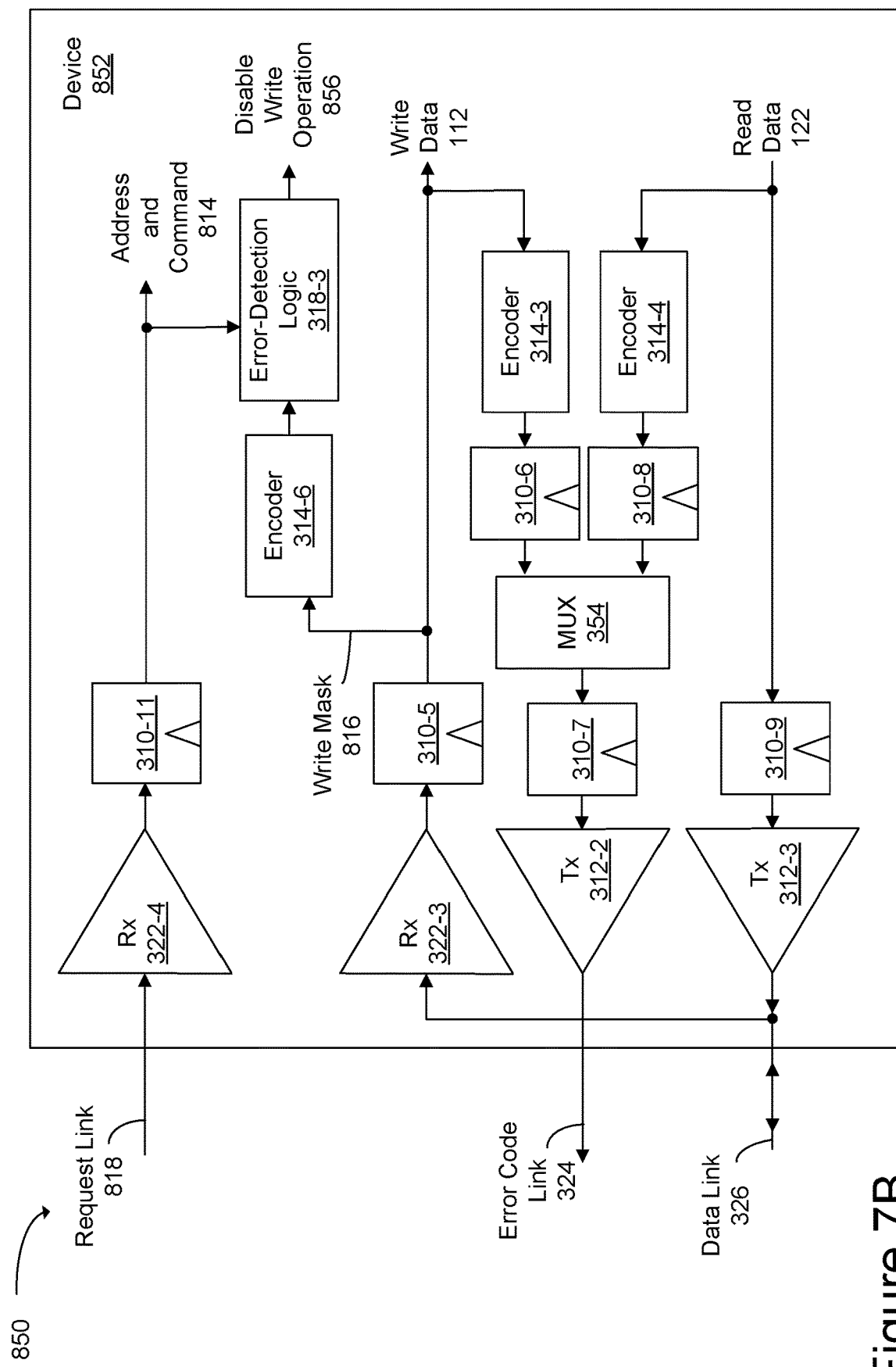
FIG. 7B is a block diagram illustrating an embodiment of a device.

FIGS. 7A and 7B illustrate embodiments of a solution to this challenge. FIG. 7A is a block diagram illustrating an embodiment 800 of a controller 810. The controller 810 may be a memory controller. A data stream containing write data 812 and write mask information is coupled to an encoder 314-5. The encoder receives the write mask information and generates first write-mask error-detection information. The first write-mask error-detection information is synchronized using a flip-flop 310-10 and is coupled to a transmitter 312-4. Address and command information 814 is synchronized using a flip-flop 310-12 and is also coupled to the transmitter 312-4. The transmitter 312-4 transmits the address and command information 814 and the first write-mask error-detection information on a request link 818. The request link 818 may operate at a lower data rate that the data link 326. Such as lower data rate may reduce a probability of an error during the communication of the first write-mask error-detection information. The write mask information 816 may also be synchronized using flip-flop 310-1 and coupled to the transmitter 312-1. The transmitter transmits the write data 812 and the write mask information 816 on the data link 326.

FIG. 7B illustrates an embodiment 850 of a device 852, which may be a memory device. The write mask information 816 may be received by receiver 322-3. The write mask information 816 may synchronized using a flip flop 310-5. The write mask information 816 may be encoded using encoder 314-6 to generate second write-mask error-detection information. The second write-mask error-detection information may be coupled to error detection logic 318-3.

The first write-mask error-detection information may be received via the request link 818 using receiver 322-4. The first write-mask error-detection information may be synchronized using flip-flop 310-11 and coupled to the error-detection logic 318-3. The error-detection logic 318-3 may compare the first write-mask error-detection information and the second write-mask error-detection information to determine if the write mask information 816 has been received without an error. If no error has occurred, the write operation is allowed to proceed. If an error has occurred, the error-detection logic 318-3 may output signals that disables a write operation 856 to a memory core, thereby prevent an accidental erasure of the data at the corresponding column address location. The device 852 may transmit retry instructions to the controller 810 (FIG. 7A), for example, using a retry link (not shown). The retry instructions may request that the write mask information 816 and/or the corresponding write data 812 be re-transmitted. The retry instructions may be processed by retry logic 820 (FIG. 7A).

The approach described in embodiments 800 (FIG. 7A) and 850 may be utilized if there is sufficient space and/or bandwidth on the request link 818. This is often the case since a row address in the address and command information 814 is typically larger in size than a corresponding column address. If there are multiple devices 852, such as multiple DRAM chips, however, there may not be sufficient communications capacity on the request link 818. In such a circumstance, a separate link may be included for the write-mask error-detection information. Alternatively, different error-detection codes may be utilized for different groups of one or more devices 852 coupled to a common request link 818.

Figure 8:
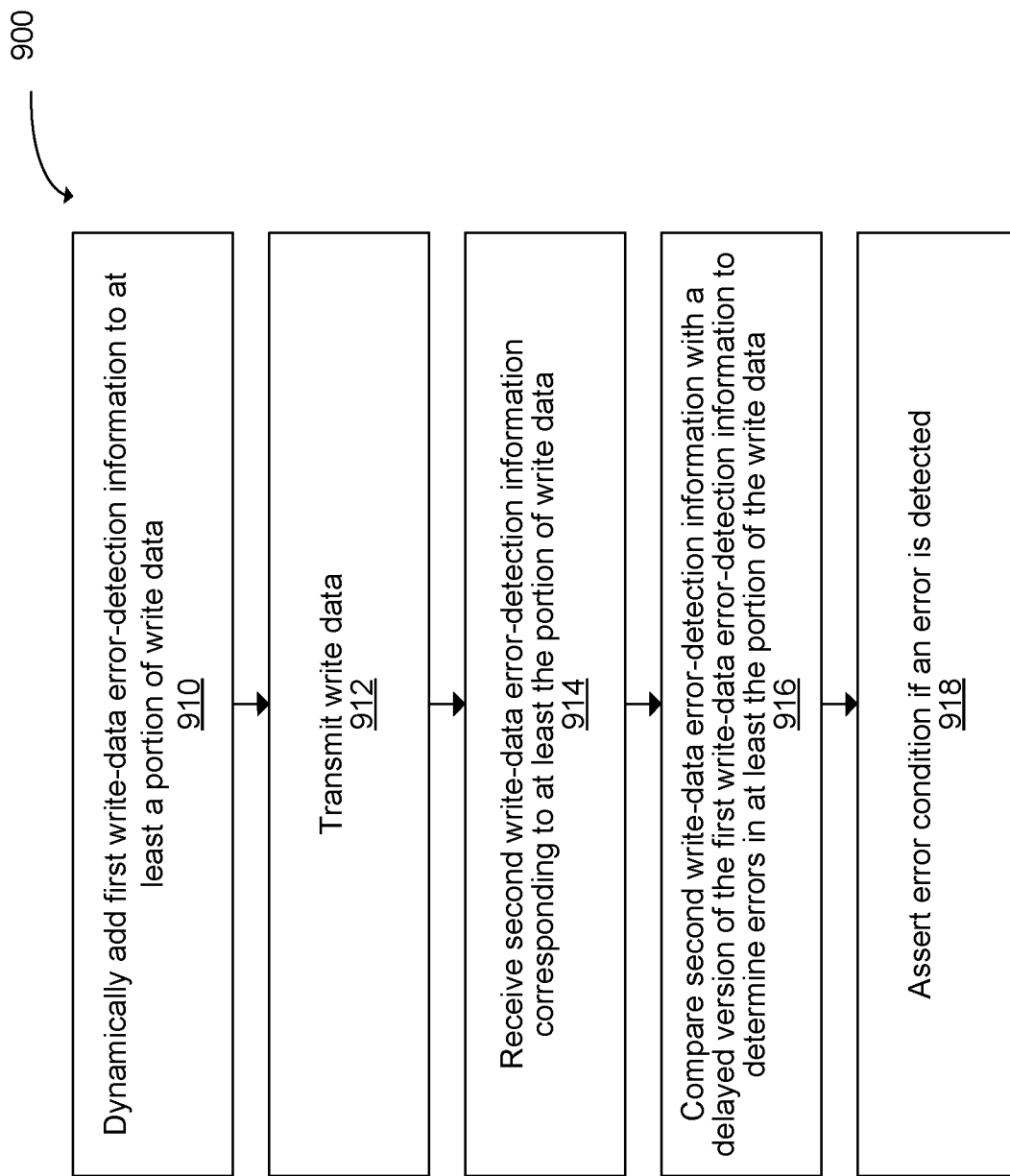
FIG. 8 is a flow diagram illustrating a method of operation of an embodiment of a system.

Attention is now directed towards processes for operating controllers, devices and/or systems. FIG. 8 is a flow diagram illustrating a method of operation of an embodiment 900 of a system. First write-data error-detection information is dynamically added to at least a portion of write data (910). Dynamically adding error-detection information may include generating (for example, in real time) and appending error-detection information. The write data is transmitted (912). Second write-data error-detection information corresponding to at least the portion of the write data is received (914). The second write-data error-detection information and a delayed version of the first write-data error-detection information are compared to determine errors in at least the portion of the write data (916). An error condition is asserted if an error is detected (918). In some embodiments, there may be fewer or additional operations, an order of the operations may be rearranged and/or two or more operations may be combined.

Figure 9:
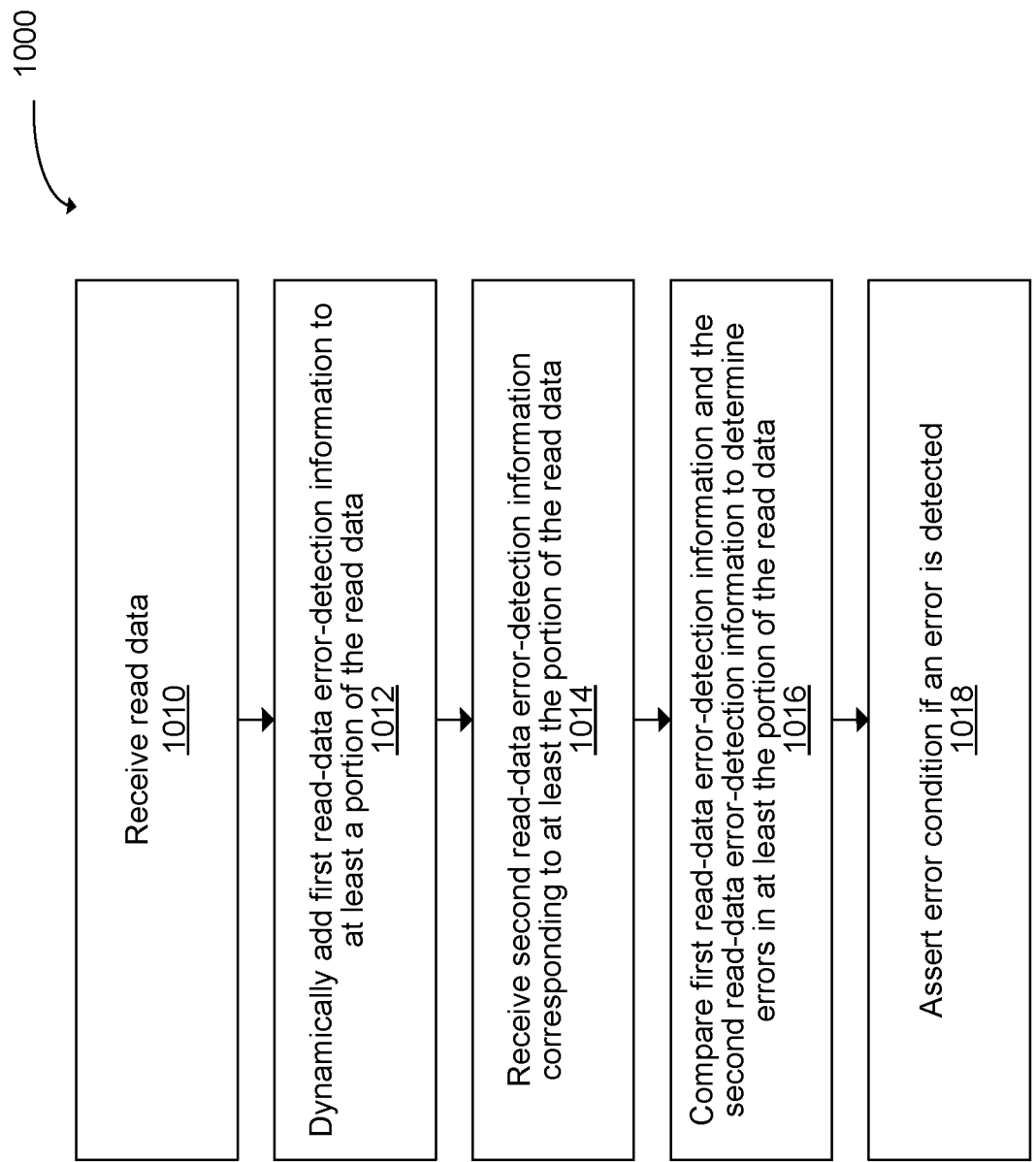
FIG. 9 is a flow diagram illustrating a method of operation of an embodiment of a system.

FIG. 9 is a flow diagram illustrating a method of operation of an embodiment 1000 of a system. Read data is received (1010). First read-data error-detection information is dynamically added to at least a portion of the read data (1012). Second read-data error-detection information corresponding to at least the portion of the read data is received (1014). The first read-data error-detection information and the second read-data error-detection information are compared to determine errors in at least the portion of the read data (1016). An error condition is asserted if an error is detected (1018). In some embodiments, there may be fewer or additional operations, an order of the operations may be rearranged and/or two or more operations may be combined.

Figure 10:
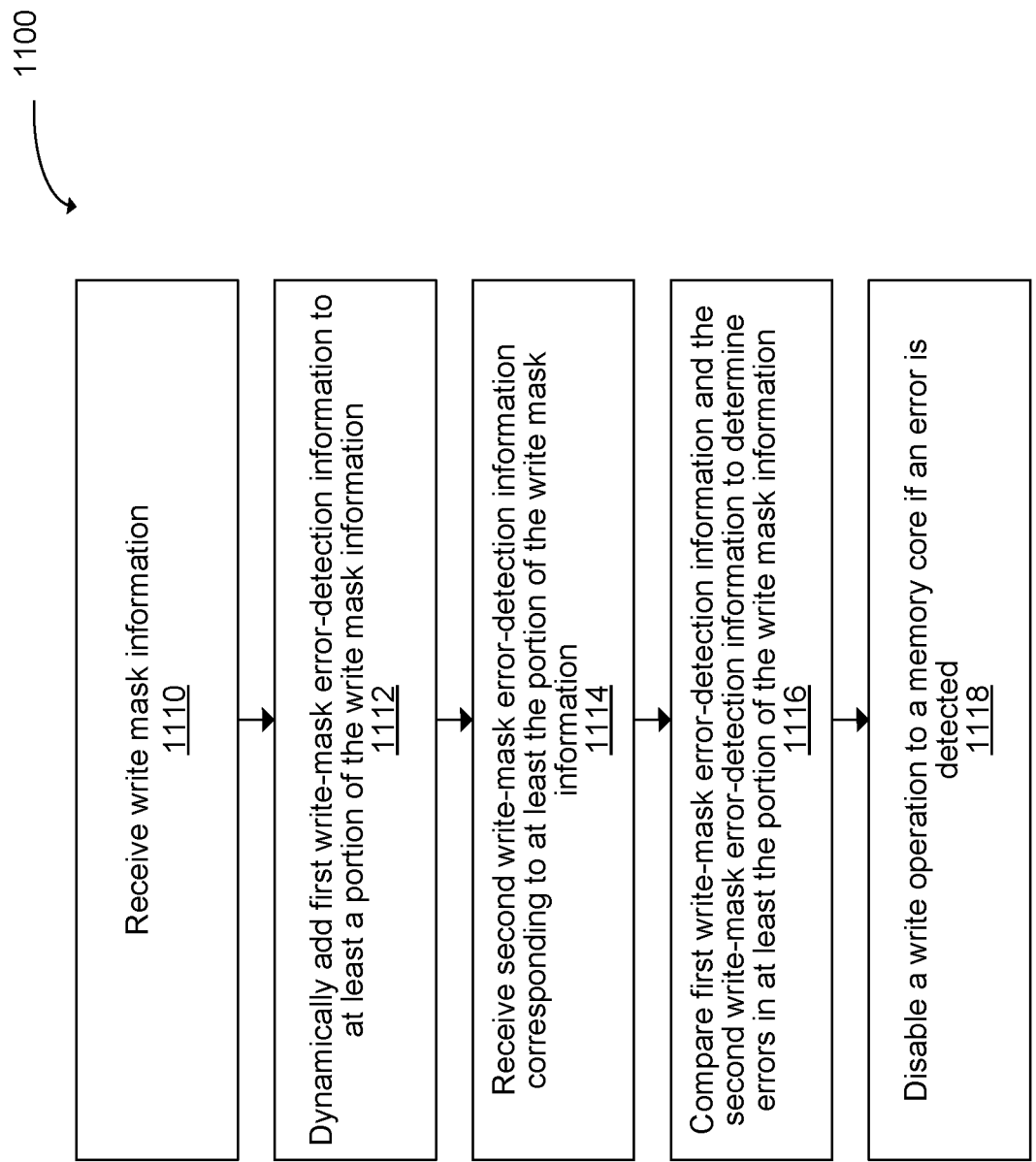
FIG. 10 is a flow diagram illustrating a method of operation of an embodiment of a system.

FIG. 10 is a flow diagram illustrating a method of operation of an embodiment 1100 of a system. Write mask information is received (1110). First write-mask error-detection information is dynamically added to at least a portion of the write mask information (1112). Second write-mask error-detection information corresponding to at least the portion of the write mask information is received (1114). The first write-mask error-detection information and the second write-mask error-detection information are compared to determine errors in at least the portion of the write mask information (1116). A write operation to a memory core is disabled if an error is detected (1118). In some embodiments, there may be fewer or additional operations, an order of the operations may be rearranged and/or two or more operations may be combined.

The unidirectional transfer of error-detection information and related methods of operation are well-suited for use in improving communication in systems and devices. They are also well-suited for use in improving communication between a memory controller chip and a DRAM chip. The DRAM chip may be either on the same printed circuit board as the controller or embedded in a memory module. The apparatus and methods described herein may also be applied to other memory technologies, such as static random access memory (SRAM) and electrically erasable programmable read-only memory (EEPROM).

Devices and circuits described herein can be implemented using computer aided design tools available in the art, and embodied by computer readable files containing software descriptions of such circuits, at behavioral, register transfer, logic component, transistor and layout geometry level descriptions stored on storage media or communicated by carrier waves. Data formats in which such descriptions can be implemented include, but are not limited to, formats supporting behavioral languages like C, formats supporting register transfer level RTL languages like Verilog and VHDL, and formats supporting geometry description languages like GDSII, GDSIII, GDSIV, CIF, MEBES and other suitable formats and languages. Data transfers of such files on machine readable media including carrier waves can be done electronically over the diverse media on the Internet or through email, for example. Physical files can be implemented on machine readable media such as 4 mm magnetic tape, 8 mm magnetic tape, 3½ inch floppy media, CDs, DVDs and so on.

Figure 11:
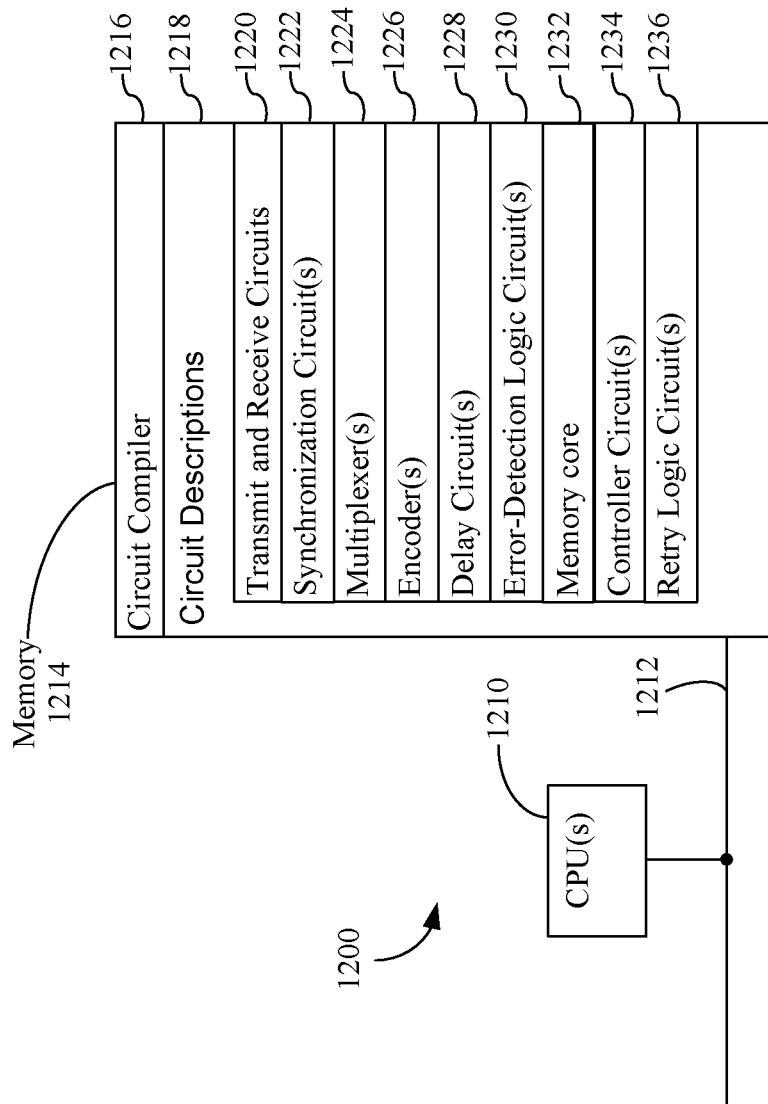
FIG. 11 is a block diagram illustrating an embodiment of a system.

FIG. 11 is a block diagram an embodiment of a system 1200 for storing computer readable files containing software descriptions of the circuits. The system 1200 may include at least one data processor or central processing unit (CPU) 1210, a memory 1214 and one or more signal lines 1212 for coupling these components to one another. The one or more signal lines 1212 may constitute one or more communications busses.

The memory 1214 may include high-speed random access memory and/or non-volatile memory, such as one or more magnetic disk storage devices. The memory 1214 may store a circuit compiler 1216 and circuit descriptions 1218. The circuit descriptions 1218 may include circuit descriptions for transmit and receive circuits 1220, one or more synchronization circuits 1222 (such as flip-flops), one or more multiplexers 1224, one or more encoders 1226, one or more delay circuits 1228, one or more error-detection logic circuits 1230, one or more memory cores 1232, one or more controller circuits 1234 and/or one or more retry logic circuits 1236.

Attention is now directed towards additional embodiments of unidirectional error-code transfer. In some embodiments, a controller includes a link interface, a first encoder, a first transmitter, a first delay element coupled to an output from the first encoder, a first receiver coupled to the link interface, a second encoder coupled to an output from the first receiver, a second receiver coupled to the link interface, and error-detection logic coupled to an output from the first delay element, an output from the second encoder and an output from the second receiver. The link interface is to couple to a first link to communicate bi-directional data and a second link to transmit unidirectional error-detection information. The first encoder is to dynamically add first error-detection information to at least a portion of write data. The first transmitter is to transmit the write data. The first receiver is to receive read data. The second encoder is to dynamically add second error-detection information to at least a portion of the read data. The second receiver is to receive third error-detection information corresponding to at least the portion of the read data and fourth error-detection information corresponding to at least the portion of the write data. The error-detection logic is to determine errors in at least the portion of the write data by comparing the first error-detection information and the fourth error-detection information, and is to determine errors in at least the portion of the read data by comparing the second error-detection information and the third error-detection information, and, if an error is detected, is to assert an error condition.

The controller may include retry logic to perform a retry remedial action if the error condition is asserted. In some embodiments, the retry remedial action includes re-transmitting the write data using the first transmitter and the link interface. In some embodiments, the retry remedial action includes re-receiving the read data using the first receiver and the link interface after the read data is re-transmitted by a device.

The controller may include a third encoder to dynamically add fifth error-detection information to at least a portion of write mask information and a second transmitter coupled to an output from the third encoder and to the link interface. The link interface may couple to a third link to transmit unidirectional command information including the fifth error-detection information. The link interface may couple to the first link to communicate the write mask information.

In another embodiment, a device includes a link interface, a first encoder, a first transmitter is coupled to the link interface, a first receiver coupled to the link interface, a second encoder coupled to an output from the first receiver, and a second transmitter coupled to the link interface, and selectively coupled to one of an output from the first encoder and an output from the second encoder. The link interface is to couple to a first link to communicate bi-directional data and a second link to receive unidirectional error-detection information. The first encoder is to dynamically add first error-detection information to at least a portion of read data. A first transmitter is to transmit the read data. The first receiver is to receive write data. The second encoder is to dynamically add second error-detection information to at least a portion of the write data.

The read data may be re-transmitted using the first transmitter and the link interface if the device receives remedial action instructions from a controller.

The write data may be re-received using the first receiver and the link interface if the device receives remedial action instructions from a controller.

The device may include a third encoder coupled to an output from the first receiver, a second receiver coupled to the link interface, and error-detection logic coupled to an output from the second receiver and an output from the third encoder. The third encoder is to dynamically add third error-detection information to at least a portion of write mask information. The link interface is to couple to a third link to receive unidirectional command information including fourth error-detection information. The error-detection logic is to determine errors in at least the portion of the write mask information by comparing the third error-detection information and the fifth error-detection information, and, if an error is detected, is to disable a write operation to a memory core.

In other embodiments, a system includes a first link to communicate bi-directional data, a second link to communicate unidirectional error-detection information, a controller, and a device. The controller includes a first link interface coupled to the first link and the second link, a first encoder to dynamically add first error-detection information to at least a portion of write data, a first transmitter coupled to the first link interface, a first delay element coupled to an output from the first encoder, a first receiver coupled to the first link interface, a second encoder coupled to an output from the first receiver, a second receiver coupled to the first link interface, and first error-detection logic coupled to an output from the first delay element, an output from the second encoder and an output from the second receiver. The first transmitter is to transmit the write data. The first receiver is to receive read data. The second encoder is to dynamically add second error-detection information to at least a portion of the read data. The second receiver is to receive third error-detection information corresponding to at least the portion of the read data and fourth error-detection information corresponding to at least the portion of the write data. The first error-detection logic is to determine errors in at least the portion of the write data by comparing the first error-detection information and the fourth error-detection information, and is to determine errors in at least the portion of the read data by comparing the second error-detection information and the third error-detection information, and, if an error is detected, is to assert an error condition. The device includes a second link interface coupled to the first link and the second link, a third encoder to dynamically add the third error-detection information to at least a portion of the read data, a second transmitter coupled to the second link interface, a third receiver coupled to the second link interface, a fourth encoder coupled to an output from the third receiver, and a third transmitter coupled to the second link interface, and selectively coupled to one of an output from the third encoder and an output from the fourth encoder. The second transmitter is to transmit the read data. The third receiver is to receive the write data. The fourth encoder is to dynamically add the fourth error-detection information to at least a portion of the write data.

A retry remedial action may be performed if the error condition is asserted. In some embodiments, the retry remedial action includes instructions for re-transmitting the write data using the first transmitter and the link interface in the controller. In some embodiments, the retry remedial action includes instructions re-receiving the read data using the first receiver and the link interface in the controller after the read data is re-transmitted using the second transmitter and the second link interface in the device.

The system may include a third link to communicate unidirectional command information. The controller may include a fifth encoder to dynamically add fifth error-detection information to at least a portion of write mask information and a fourth transmitter coupled to an output from the third encoder and to the link interface. The first link interface is coupled to a third link to transmit unidirectional seventh error-detection information. The first link interface is coupled to the first link to communicate the write mask information. The device may include a sixth encoder coupled to an output from the third receiver, a fourth receiver coupled to the second link interface, and a second error-detection logic coupled to an output from the fourth receiver and an output from the fourth encoder. The sixth encoder is to dynamically add sixth error-detection information to at least a portion of the write mask information. The second link interface is coupled to the third link and the fourth receiver is to receive the fifth error-detection information. The second error-detection logic is to determine errors in at least the portion of the write mask information by comparing the fifth error-detection information and the sixth error-detection information, and, if an error is detected, is to disable a write operation to a memory core.

In another embodiment, a controller includes a link interface, an encoder to dynamically add first error-detection information to at least a portion of write data, a transmitter coupled to the link interface, a delay element coupled to an output from the encoder, a receiver coupled to the link interface, and error-detection logic coupled to an output from the delay element and an output from the receiver. The link interface is to couple to a first link to communicate bi-directional data and a second link to transmit unidirectional error-detection information. The transmitter is to transmit the write data. The receiver is to receive second error-detection information corresponding to at least the portion of the write data. The error-detection logic is to determine errors in at least the portion of the write data by comparing the first error-detection information and the second error-detection information, and, if an error is detected, is to assert an error condition.

In another embodiment, a controller includes a link interface, a first receiver coupled to the link interface, an encoder coupled to an output from the first receiver, a second receiver coupled to the link interface, and error-detection logic coupled to an output from the encoder and an output from the second receiver. The link interface is to couple to a first link to communicate bi-directional data and a second link to transmit unidirectional error-detection information. The first receiver is to receive read data. The encoder is to dynamically add first error-detection information to at least a portion of the read data. The second receiver is to receive second error-detection information corresponding to at least the portion of the read data. The error-detection logic is to determine errors in at least the portion of the read data by comparing the first error-detection information and the second error-detection information, and, if an error is detected, is to assert an error condition.

In another embodiments, a system includes a link to communicate bi-directional data and unidirectional error-detection information, a controller, and a device. The controller includes a first link interface, a first encoder to dynamically add first error-detection information to at least a portion of write data, a first transmitter coupled to the first link interface, a first delay element coupled to an output from the first encoder, a first receiver coupled to the link interface, a second encoder coupled to an output from the first receiver and selectively coupled to an output from the first delay element, and error-detection logic coupled to an output from the second encoder and an output from the first receiver. The first link interface is to couple to the link. The first transmitter is to transmit the write data. The first receiver is to receive read data and second error-detection information corresponding to at least a portion of the read data and at least the portion of the write data. The second encoder is to dynamically add third error-detection information to at least the portion of the read data and at least the portion of the write data. The error-detection logic is to determine errors in at least the portion of the write data and at least the portion of the read data by comparing the second error-detection information and the third error-detection information, and, if an error is detected, is to assert an error condition. The device includes a second link interface, a second receiver coupled to the second link interface, a third encoder to dynamically add fourth error-detection information to at least a portion of write data, a second delay element coupled to an output from the third encoder, a fourth encoder coupled to read data and selectively coupled to an output from the second delay element, and a second transmitter coupled to the second link interface, selectively coupled to the read data and selectively coupled to an output from the fourth encoder. The second link interface is to couple to the link. The receiver is to receive write data. The fourth encoder is to dynamically add the second error-detection information to at least the portion of the write data and at least a portion of the read data. The second transmitter is to transmit the read data and the second error-detection information.

In another embodiment, a device includes a link interface, a receiver coupled to the link interface, a first encoder to dynamically add first error-detection information to at least a portion of write data, a delay element coupled to an output from the first encoder, a second encoder coupled to read data and selectively coupled to an output from the delay element, and a first transmitter coupled to the link interface, selectively coupled to the read data and selectively coupled to an output from the second encoder. The link interface is to couple to a link to communicate bi-directional data and unidirectional error-detection information. The receiver is to receive write data. The second encoder is to dynamically add second error-detection information to at least the portion of the write data and at least a portion of the read data. The first transmitter is to transmit the read data and the second error-detection information.

In another embodiment, a controller includes a link interface, a first encoder to dynamically add first error-detection information to at least a portion of write data, a transmitter coupled to the link interface, a delay element coupled to an output from the first encoder, a receiver coupled to the link interface, a second encoder coupled to an output from the receiver and selectively coupled to an output from the delay element, and error-detection logic coupled to an output from the second encoder and an output from the receiver. The link interface is to couple to a link to communicate bi-directional data and unidirectional error-detection information. The transmitter is to transmit the write data. The first receiver is to receive read data and second error-detection information corresponding to at least a portion of the read data and at least the portion of the write data. The second encoder is to dynamically add third error-detection information to at least the portion of the read data and at least the portion of the write data. The error-detection logic is to determine errors in at least the portion of the write data and at least the portion of the read data by comparing the second error-detection information and the third error-detection information, and, if an error is detected, is to assert an error condition.

In another embodiment, a device includes a link interface, a first receiver coupled to the link interface, an encoder to dynamically add first error-detection information to at least a portion of the write mask information, a second receiver coupled to the link interface, and error-detection logic coupled to an output from the second receiver and an output from the encoder. The link interface is to couple to a first link to communicate write mask information and a second link to receive unidirectional error-detection information. The first receiver is to receive the write mask information. The second receiver is to receive second error-detection information. The error-detection logic is to determine errors in at least the portion of the write mask information by comparing the first error-detection information and the second error-detection information received by the second receiver, and, if an error is detected, is to disable a write operation to a memory core.

The foregoing descriptions of specific embodiments of the present invention are presented for purposes of illustration and description. They are not intended to be exhaustive or to limit the invention to the precise forms disclosed. Rather, it should be appreciated that many modifications and variations are possible in view of the above teachings. The embodiments were chosen and described in order to best explain the principles of the invention and its practical applications, to thereby enable others skilled in the art to best utilize the invention and various embodiments with various modifications as are suited to the particular use contemplated.

What is claimed is:

1. A solid state memory device, comprising:
    a link interface configurable in a first configuration and a second configuration, the first configuration to be for bidirectional communication with a controller via the link interface, the second configuration to be for unidirectional communication with the controller via the link interface, wherein the link interface includes:
        receiver circuitry to receive command information, command error detection information associated with the command information, and remedial action instructions from the controller; and
        circuitry to communicate a group of data bits with the controller based on the command information, the group of data bits to be time multiplexed with error-detection information; and,
    circuitry to, based on the remedial action instructions, perform a remedial action.

2. The solid state memory device of claim 1, wherein the remedial action includes a retry remedial action.

3. The solid state memory device of claim 2, wherein the retry remedial action includes re-receiving the group of data bits and the error-detection information.

4. The solid state memory device of claim 2, wherein the retry remedial action includes re-transmitting the group of data bits.

5. The solid state memory device of claim 2, wherein the remedial action includes switching the link interface from the first configuration to the second configuration.

6. The solid state memory device of claim 1, wherein the error-detection information is to include a cyclic redundancy check (CRC) code.

7. The solid state memory device of claim 2, wherein the retry remedial action includes re-transmitting the group of data bits and re-receiving the error-detection information.

8. A method, comprising:
    configuring a link interface in a first configuration and a second configuration, the first configuration to be for bidirectional communication with a controller via the link interface, the second configuration to be for unidirectional communication with the controller via the link interface, wherein the link interface includes:
    in one of the first configuration and the second configuration, receiving command information, command error detection information associated with the command information, and remedial action instructions from the controller;
    communicating a group of data bits with the controller based on the command information, the group of data bits being time multiplexed with data error-detection information; and,
    based at least in part on the remedial action instructions, performing a remedial action.

9. The method of claim 8, wherein the remedial action includes a retry remedial action.

10. The method of claim 9, wherein the retry remedial action includes re-receiving the group of data bits and the error-detection information.

11. The method of claim 9, wherein the retry remedial action includes re-transmitting the group of data bits.

12. The method of claim 9, wherein the remedial action includes switching the link interface from the first configuration to the second configuration.

13. The method of claim 8, wherein the error-detection information is to include a cyclic redundancy check (CRC) code.

14. The method of claim 9, wherein the retry remedial action includes re-transmitting the group of data bits and re-receiving the error-detection information.

15. An integrated circuit, comprising:
    a bi-modal link interface configurable in a first configuration to be for bidirectional operation and in a second configuration to be for unidirectional communication, the bi-modal link interface including:
        receiver circuitry to receive, from a controller, command information, command error detection information associated with the command information, and a remedial action indicator; and
        circuitry to communicate, with the controller, a group of data bits based on the command information, the group of data bits being time multiplexed with read data error-detection information;
    remedial action circuitry to, based on the remedial action indicator, perform a remedial action.

16. The integrated circuit of claim 15, wherein the remedial action includes a retry remedial action.

17. The integrated circuit of claim 16, wherein the retry remedial action includes re-receiving the group of data bits and the error-detection information.

18. The integrated circuit of claim 16, wherein the retry remedial action includes re-transmitting the group of data bits.

19. The integrated circuit of claim 16, wherein the remedial action includes switching the link interface from the first configuration to the second configuration.

20. The integrated circuit of claim 15, wherein the error-detection information is to include a cyclic redundancy check (CRC) code.

\* \* \* \* \*